(12) United States Patent
Jeon et al.

(10) Patent No.: US 8,563,371 B2
(45) Date of Patent: Oct. 22, 2013

(54) METHOD OF FORMING SEMICONDUCTOR DEVICE

(75) Inventors: Kyung-Yub Jeon, Seoul (KR);
 Kyoung-Sub Shin, Seongnam-si (KR);
 Jun-Ho Yoon, Suwon-si (KR); Je-Woo Han, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 245 days.

(21) Appl. No.: 13/216,051

(22) Filed: Aug. 23, 2011

(65) Prior Publication Data

US 2012/0064709 A1  Mar. 15, 2012

(30) Foreign Application Priority Data

Sep. 13, 2010 (KR) .................. 10-2010-0089655

(51) Int. Cl.
 *H01L 21/84* (2006.01)
 *H01L 21/00* (2006.01)
 *H01L 21/8238* (2006.01)
 *H01L 21/461* (2006.01)
 *H01L 21/302* (2006.01)

(52) U.S. Cl.
 USPC .... 438/166; 438/211; 438/736; 257/E21.023;
 257/E21.035; 257/E21.232; 257/E21.246;
 257/E21.29

(58) Field of Classification Search
 USPC .............. 438/166, 211, 736; 257/E21.023,
 257/E21.035, E21.232, E21.246, E21.29
 See application file for complete search history.

(56) References Cited

U.S. PATENT DOCUMENTS 6,526,724 B1 * 3/2003 Tazaki et al. .................. 53/173
7,167,686 B2  1/2007 See et al.
(Continued)

FOREIGN PATENT DOCUMENTS

| JP | 2002-299960 | 10/2002 |
| JP | 2005516519 | 6/2005 |
| JP | 2006-033822 | 2/2006 |
| KR | 1020040078135 A | 9/2004 |

(Continued)

OTHER PUBLICATIONS

Corrado Spinella, et al., "Crystal grain nucleation in amorphous silicon", Journal of Applied Physics, vol. 84, No. 10, Nov. 15, 1998, pp. 5383-5414.

*Primary Examiner* — Mohsen Ahmadi
(74) *Attorney, Agent, or Firm* — F. Chau & Associates, LLC

(57) ABSTRACT

Provided is a method of forming a semiconductor device. The method may include forming a first insulating layer on a semiconductor substrate. A first polycrystalline silicon layer may be formed on the first insulating layer. A second insulating layer may be formed on the first polycrystalline silicon layer. A second polycrystalline silicon layer may be formed on the second insulating layer. A mask pattern may be formed on the second polycrystalline silicon layer. The second polycrystalline silicon layer may be patterned using the mask pattern as an etch mask to form a second polycrystalline silicon pattern exposing a portion of the second insulating layer. A sidewall of the second polycrystalline silicon pattern may include a first amorphous region. The first amorphous region may be crystallized by a first recrystallization process. The exposed portion of the second insulating layer may be removed to form a second insulating pattern exposing a portion of the first polycrystalline silicon layer. The exposed portion of the first polycrystalline silicon layer may be removed to form a first polycrystalline silicon pattern exposing a portion of the first insulating layer. The exposed portion of the first insulating layer may be removed to form a first insulating pattern exposing a portion of the semiconductor substrate.

17 Claims, 17 Drawing Sheets

(56) References Cited

U.S. PATENT DOCUMENTS

| | | |
|---|---|---|
| 7,499,688 B2 | 3/2009 | Uozumi et al. |
| 2009/0065779 A1* | 3/2009 | Kusumoto ............... 257/66 |
| 2011/0230056 A1* | 9/2011 | Kim et al. ............... 438/763 |

FOREIGN PATENT DOCUMENTS

| | | |
|---|---|---|
| KR | 1020050042543 | 5/2005 |
| KR | 1020060025295 | 3/2006 |
| KR | 1020060079287 | 7/2006 |

* cited by examiner

METHOD OF FORMING SEMICONDUCTOR DEVICE

CROSS-REFERENCE TO RELATED APPLICATION

This application claims under 35 U.S.C. §119 priority to and the benefit of Korean Patent Application No. 10-2010-0089655, filed on Sep. 13, 2010, the entire disclosure of which is hereby incorporated by reference herein in its entirety.

BACKGROUND

1. Technical Field

The present disclosure relates to a semiconductor device, and, more particularly, to a method of forming a semiconductor device.

2. Description of Related Art

Recently, semiconductor devices have been fabricated by reducing a design rule of a gate structure on a semiconductor substrate for embodying highly integrated semiconductor devices. In this case, the gate structure may be formed in a multi-layer.

SUMMARY

An exemplary embodiment of the present application's inventive concept provides a method of forming a semiconductor device.

An exemplary embodiment also provides an information storage medium including a semiconductor device.

An exemplary embodiment also provides an information processing system including a semiconductor device.

Exemplary embodiments of the inventive concept are not limited to the foregoing embodiments and are fully understood by one of ordinary skill in the art to which this inventive concept belongs, through the following illustration.

According to an exemplary embodiment of, the inventive concept a method of forming a semiconductor device is provided. The method includes forming a first insulating layer on a semiconductor substrate. A first polycrystalline silicon layer may be formed on the first insulating layer. A second insulating layer may be formed on the first polycrystalline silicon layer. A second polycrystalline silicon layer may be formed on the second insulating layer. A mask pattern may be formed on the second polycrystalline silicon layer. The second polycrystalline silicon layer may be patterned using the mask pattern as an etch mask to form a second polycrystalline silicon pattern exposing a portion of the second insulating layer. A sidewall of the second polycrystalline silicon pattern may include an amorphous region. The amorphous region may be crystallized by a first recrystallization process. The exposed portion of the second insulating layer may be removed to form a second insulating pattern exposing a portion of the first polycrystalline silicon layer. The exposed portion of the first polycrystalline silicon layer may be removed to form a first polycrystalline silicon pattern exposing a portion of the first insulating layer. The exposed portion of the first insulating layer may be removed to form a first insulating pattern exposing a portion of the semiconductor substrate.

In an exemplary embodiment, the semiconductor substrate may include single crystalline silicon. And the first insulating layer may include at least one of silicon oxide and metal oxide.

In an exemplary embodiment, the second insulating layer may include at least one of silicon nitride and metal oxide.

In an exemplary embodiment, the second insulating layer may further include silicon oxide.

In an exemplary embodiment, the mask pattern may include at least one selected from silicon oxide, silicon nitride, and silicon oxynitride.

In an exemplary embodiment, the forming of the mask pattern may include forming a mask layer on the second polycrystalline silicon layer. A photoresist pattern may be formed on the mask layer. The mask layer may be dry-etched using the photoresist pattern as an etch mask under an atmosphere of a gas including carbon (C) and fluorine (F). The photoresist pattern may be removed from the semiconductor substrate.

In an exemplary embodiment, the forming of the first or second polycrystalline silicon pattern may include dry-etching the first or second polycrystalline silicon layer using a gas including hydrogen bromide (HBr).

In an exemplary embodiment, the gas may further include helium (He) and oxygen ($O_2$).

In an exemplary embodiment, the forming of the first or second insulating pattern may include dry-etching the first or second insulating layer by using a gas including C and F.

In an exemplary embodiment, the first recrystallization process may be performed at a temperature of about 500° C. or higher.

In an exemplary embodiment, the first recrystallization process may be performed at a temperature of about 1000° C. or higher using a rapid thermal annealing technique.

In an exemplary embodiment, the first recrystallization process may be performed for about 5 seconds to about 30 seconds.

In an exemplary embodiment, the first recrystallization process may be performed under an inert gas atmosphere.

In an exemplary embodiment, the inert gas may include one selected from the group consisting of nitrogen ($N_2$), helium (He), neon (Ne), argon (Ar), krypton (Kr), xenon (Xe), radon (Rn) and ununoctium (Uuo).

In an exemplary embodiment, after the forming of the second insulating pattern, the method may further include performing a second recrystallization process.

In an exemplary embodiment, after the forming of the first insulating pattern, the method may further include performing a third recrystallization process.

In an exemplary embodiment, the third recrystallization process may include forming a capping insulating layer. The capping insulating layer may cover the semiconductor substrate, the first insulating pattern, the first polycrystalline silicon pattern, the second insulating pattern and the second polycrystalline silicon pattern.

In an exemplary embodiment, the capping insulating layer may include silicon oxide.

According to an exemplary embodiment of the inventive concept, a method of forming a semiconductor device is provided. The method includes forming a first insulating layer on a semiconductor substrate. A first polycrystalline silicon layer may be formed on the first insulating layer. A second insulating layer may be formed on the first polycrystalline silicon layer. A second polycrystalline silicon layer may be formed on the second insulating layer. A mask pattern may be formed on the second polycrystalline silicon layer. The second polycrystalline silicon layer may be patterned using the mask pattern as an etch mask to form a second polycrystalline silicon pattern exposing a portion of the second insulating layer. The exposed portion of the second insulating layer is removed to form a second insulating pattern exposing a portion of the first polycrystalline silicon layer. A sidewall of the second polycrystalline silicon pattern and the exposed portion of the first polycrystalline silicon layer may include amorphous regions. The amorphous regions on the sidewall of the second polycrystalline silicon pattern and the exposed portion of the first polycrystalline silicon layer may be crystallized by the recrystallization process. The exposed portion of the first polycrystalline silicon layer may be removed to form a first polycrystalline silicon pattern exposing a portion of the first insulating layer. The exposed portion of the first insulating layer may be removed to form a first insulating pattern exposing a portion of the semiconductor substrate.

According to an exemplary embodiment of the inventive a method of forming a semiconductor device is provided. The method includes forming a lower insulating layer on a semiconductor substrate. A lower gate layer may be formed on the lower insulating layer. An upper insulating layer may be formed on the lower gate layer. An upper gate layer may be formed on the upper insulating layer. The upper gate layer may be patterned to form an upper gate electrode. A sidewall of the upper gate electrode may include a damaged region. The damaged region may be cured by performing a heat annealing process at a temperature of about 500° C. or higher. The upper insulating layer may be patterned to form an upper insulating pattern. The lower gate layer may be patterned to form a lower gate electrode. The lower insulating layer may be patterned to form a lower insulating pattern. The lower and upper gate layers may include the same material. And the upper insulating layer may include a lower silicon oxide film, a silicon nitride film on the lower silicon oxide film, and an upper silicon oxide film on the silicon nitride film.

According to an exemplary embodiment of the inventive concept, a method of forming a semiconductor device is provided. The method includes forming an insulating layer on a semiconductor substrate, forming a conductive layer on the insulating layer, forming a mask layer on the conductive layer, forming a photoresist pattern on the mask layer, patterning the conductive layer, the mask layer and the insulating layer using the semiconductor substrate as an etch buffer layer to form a conductive pattern, a mask pattern and an insulating pattern on the semiconductor substrate. The conductive pattern, the mask pattern and the insulating pattern together constitute a gate structure. The method further includes removing the photoresist pattern from the semiconductor substrate after forming the gate structure, forming a capping insulating layer on the semiconductor substrate, the conductive pattern, the mask pattern, and the insulating pattern after removing the photoresist pattern. The forming of the capping insulating layer includes applying heat to the gate structure to transform a damaged region on a sidewall of the conductive pattern into a recrystallized region.

According to an exemplary embodiment of the inventive concept an information storage medium including a controller and a memory is provided. The memory may include a semiconductor device fabricated by the method of forming a semiconductor device.

According to an exemplary embodiment of the inventive concept an information processing system including a memory system including a memory controller and a memory device is provided. The memory device may include a semiconductor device fabricated by the method of forming a semiconductor device.

BRIEF DESCRIPTION OF THE DRAWINGS

Exemplary embodiments of the inventive concept can be understood in further detail from the following detailed description taken in conjunction with the accompanying drawings in which.

DETAILED DESCRIPTION OF EXEMPLARY EMBODIMENTS

Figure 1:
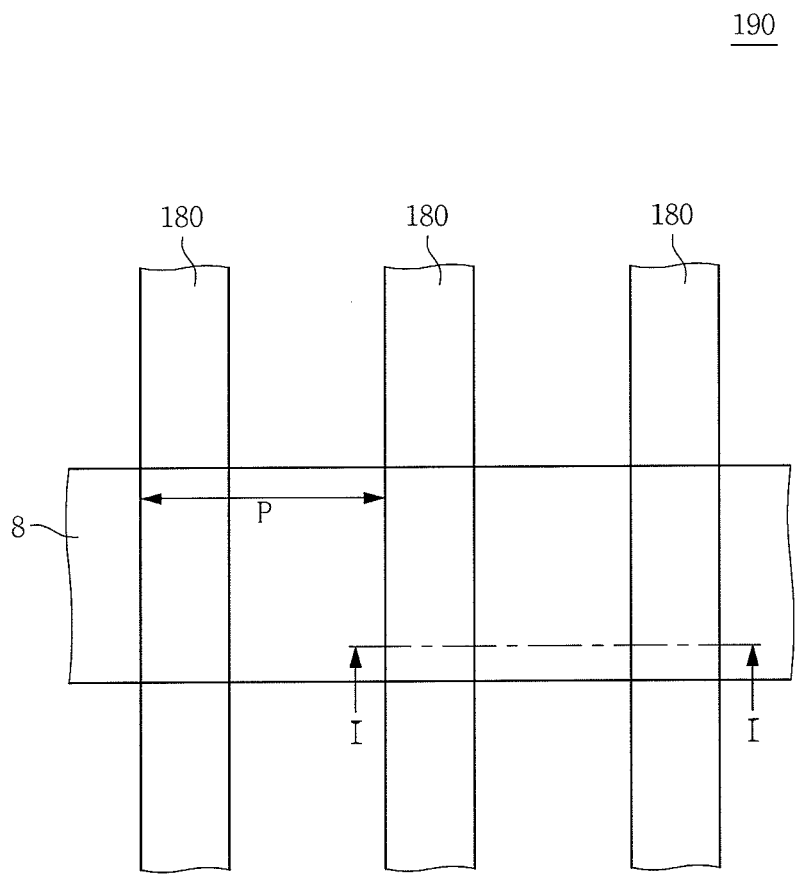
FIG. 1 is a layout view showing a semiconductor device according to an exemplary embodiment of the inventive concept.

Various embodiments will now be described in detail with reference to the accompanying drawings in which some embodiments are shown. These inventive concepts may, however, be embodied in different forms and should not be construed as limited to the embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer, or intervening elements or layers may be present. Like numerals refer to like elements throughout. As used herein, the term "and/or" includes any and all combinations of one or more of the associated listed items.

Hereinafter, a method of forming a semiconductor device according to an exemplary embodiment of the inventive concept will be described in further detail with reference to FIGS. 1 to 29.

FIG. 1 is a layout view showing a semiconductor device according to an exemplary embodiment of the inventive concept.

Referring to FIG. 1, a semiconductor device 190 according to an exemplary embodiment of the inventive concept may include, for example, an active region 8 and gate structures 180. The semiconductor device 190 may include, for example, a volatile memory device, a non-volatile memory device or a logic device. The active region 8 may intersect the gate structures 180. The active region 8 and the gate structures 180 may be disposed in a cell array region.

In this case, the gate structures 180 may be arranged at the same pitch P along the active region 8. Alternatively, the active region 8 and the gate structures 180 may be arranged in a peripheral circuit region. In this case, the gate structures 180 may be arranged at the same pitch P as or different pitches from each other.

Next, a method of forming a semiconductor device according to an exemplary embodiment of the inventive concept will be described with reference to FIGS. 2 to 29.

FIGS. 2 to 10 are cross-sectional views taken along line I-I' of FIG. 1, illustrating a method of forming a semiconductor device according to an exemplary embodiment of the inventive concept.

Figure 2:
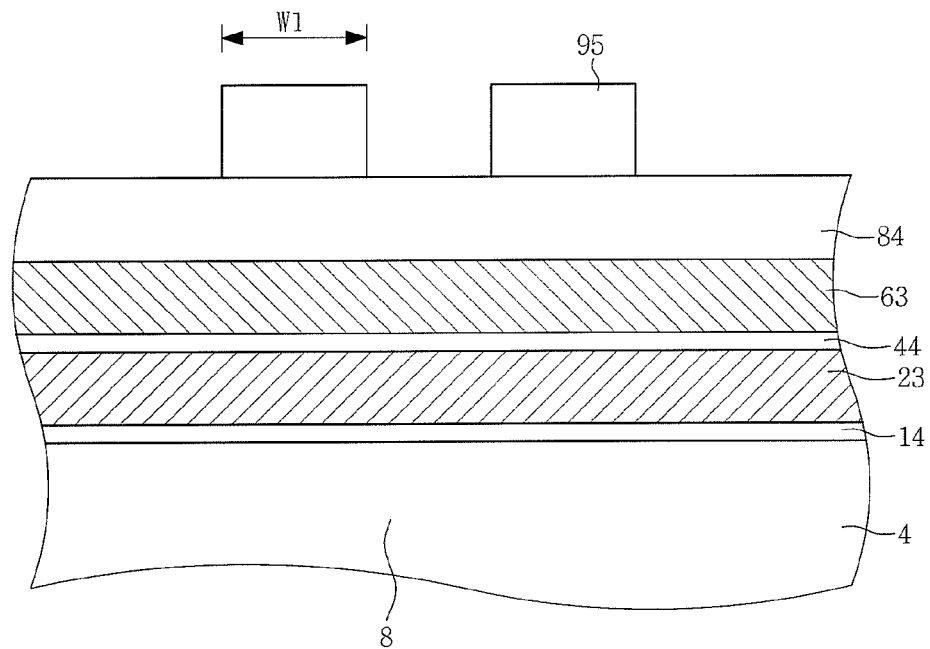
FIGS. 2 to 10 are cross-sectional views taken along line I-I' of FIG. 1, illustrating a method of forming a semiconductor device according to an exemplary embodiment of the inventive concept.

Referring to FIG. 2, a semiconductor substrate 4 may be prepared. The semiconductor substrate 4 may include, for example, single crystalline silicon. The semiconductor substrate 4 may have conductivity. The semiconductor substrate 4 may include an active region 8. The active region 8 may have an occupied area of FIG. 1 in a predetermined region of the semiconductor substrate 4. The active region 8 may be confined by an inactive region (not shown) in the semiconductor substrate 4.

For example, a first insulating layer 14, a first conductive layer 23, a second insulating layer 44, a second conductive layer 63 and a mask layer 84 are formed on the semiconductor substrate 4. The first insulating layer 14 may include, for example, silicon oxide, an inorganic oxide and/or a metal oxide such as hafnium oxide. The second insulating layer 44 may include, for example, silicon oxide, silicon nitride, an inorganic oxide and/or a metal oxide such as aluminum oxide. The second insulating layer 44 may include, for example, a silicon oxide film, a silicon nitride film and a silicon oxide film, which are sequentially stacked. The mask layer 84 may include, for example, silicon oxide, silicon nitride and/or silicon oxynitride.

The first conductive layer 23 and the second conductive layer 63 may include, for example, a metal, a metal silicide, single crystalline silicon or polycrystalline silicon. The first conductive layer 23 and the second conductive layer 63 may have conductivity. In an exemplary embodiment of the inventive concept, the first conductive layer 23 and the second conductive layer 63 may include the same material, for example, the polycrystalline silicon.

Subsequently, photoresist patterns 95 may be formed on the mask layer 84. The respective photoresist patterns 95 may have a first width W1 therein.

Figure 3:
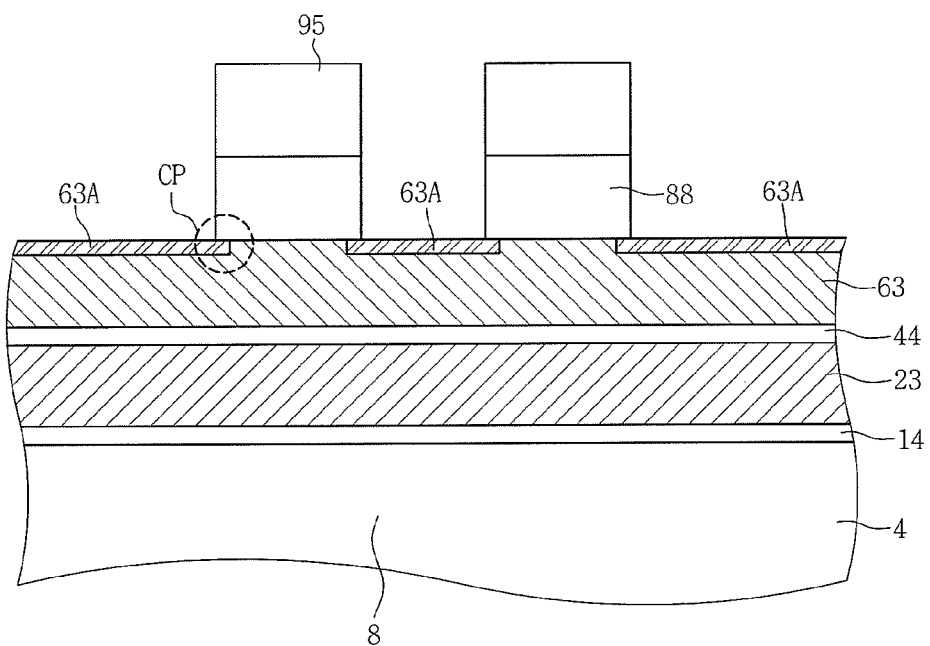

Referring to FIG. 3, the mask layer 84 may be patterned using, for example, the photoresist patterns 95 as an etch mask to form mask patterns 88. The patterning of the mask layer 84 may include partially etching the mask layer 84 using a first dry etching etchant. The first dry etching etchant may include a dry etching etchant for an insulating material, for example, carbon (C), fluorine (F), and hydrogen (H) or carbon and fluorine.

In this case, first damaged regions 63A may be formed adjacent to an upper surface of the second conductive layer 63 exposed between the mask patterns 88. When the second conductive layer 63 includes, for example, the polycrystalline silicon, the first damaged regions 63A may be, for example, an amorphized silicon region. When the second conductive layer 63 includes the metal or the metal silicide, the first damaged regions 63A may be a region having an unstable atomic bond or a rough surface.

The first damaged regions 63A may be formed by being physically and/or chemically damaged from an etching attack due to the patterning of the mask layer 84. Further, the first damaged regions 63A may horizontally extend down the mask patterns 88 as shown in a checkpoint CP of FIG. 3. The first damaged regions 63A may have a weaker etching immunity as compared with an undamaged region of the second conductive layer 63. Also, electrical characteristics such as resistances of the first damaged regions 63A may be degraded as compared with that of an undamaged region.

Thus, the curing of the first damaged regions 63A is needed to give the second conductive layer 63 a strong etching immunity and a good electrical characteristic. Hereinafter, the damaged regions may be referred to as the amorphized silicon region, or the region having the unstable atomic bond or the rough surface.

Figure 4:
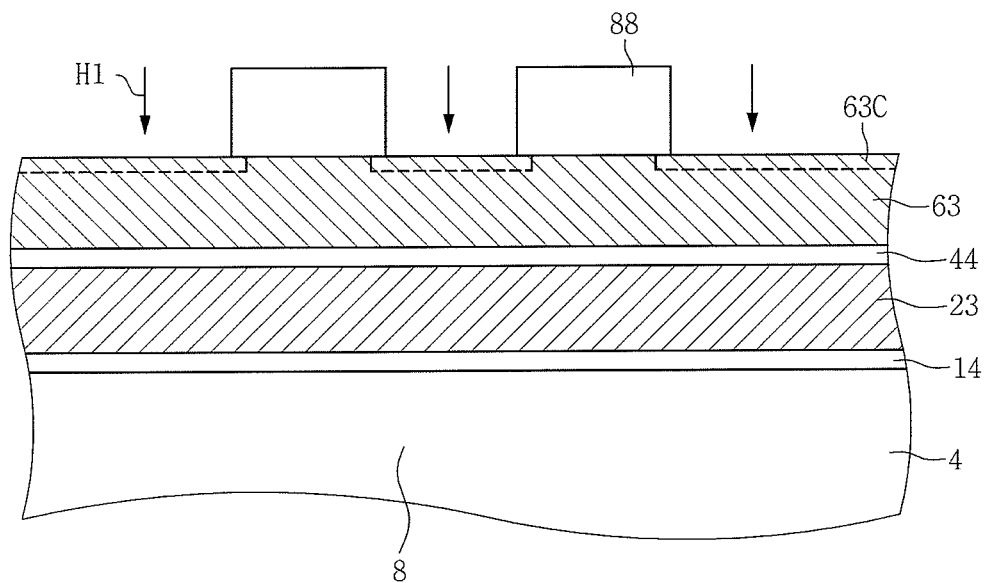

Referring to FIG. 4, the photoresist patterns 95 may be removed from the semiconductor substrate 4. Subsequently, a process may be performed to cure the first damaged regions 63A. For example, a first recrystallization process may be performed to crystallize the amorphized silicon of the first damaged regions 63A. Alternatively, the process may be performed to smooth the rough surface of the first damaged regions 63A or make a stable atomic bond in surfaces of the first damaged regions 63A.

Hereinafter, the process of curing the damaged regions may be referred to as a recrystallization process. But, the process does not exclude smoothing the rough surface of the first damaged regions 63A or making a stable atomic bond in the surfaces of the first damaged regions 63A. In this case, the first recrystallization process may recrystallize the amorphized region of the first damaged regions 63A to transform the first damaged regions 63A into first recrystallized regions 63C. The first recrystallization process may include, for example, a first heat treatment process (H1).

For example, the first heat treatment process (H1) may be performed under an inert gas atmosphere, at a temperature of higher than 500° C., for several seconds to several tens of seconds. For example, a rapid thermal annealing (RTA) technique may be performed under a gas atmosphere including nitrogen (N) or argon (Ar), at a temperature of higher than 1000° C., for about 5 seconds to about 30 seconds. The first recrystallization process may be performed at a sufficiently high temperature. Also, the first recrystallization process may stably be performed for a shorter time.

Thus, the first recrystallization process may be performed at a higher temperature than 500° C. As a temperature of the first recrystallization process is higher, a necessary time for the first recrystallization process may become shorter. The first recrystallization process will be illustrated in further detail in FIG. 32. Hereinafter, the detailed illustration of the first recrystallization process is omitted.

The first recrystallized regions 63C may have the same etching immunity as or a similar etching immunity to the undamaged region by the first recrystallization process. Thus, the second conductive layer 63 may have the same etching immunity as or a similar etching immunity to the first conductive layer 23.

Figure 5:
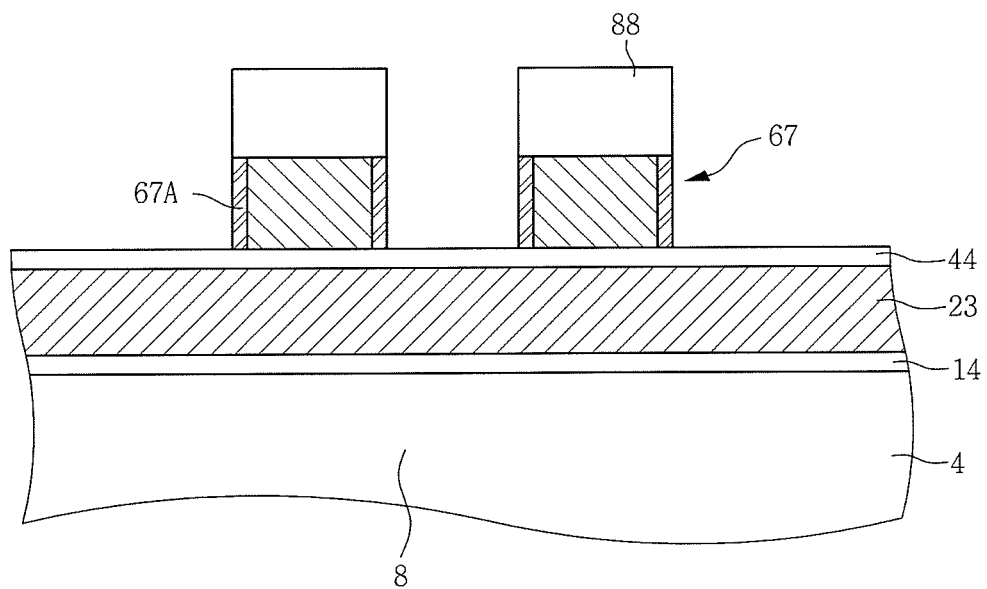

Referring to FIG. 5, the second conductive layer 63 may be patterned using, for example, the mask patterns 88 as an etch mask to form second conductive patterns 67. The patterning of the second conductive layer 63 may include, for example, partially removing the second conductive layer 63 using a second dry etching etchant. The second dry etching etchant may include a dry etching etchant for silicon, for example, hydrogen (H), bromine (Br), helium (He) and/or oxygen (O).

Sidewalls of the second conductive patterns 67 may be aligned with sidewalls of the mask patterns 88. Second damaged regions 67A may be formed on the sidewalls of the second conductive patterns 67.

Figure 6:
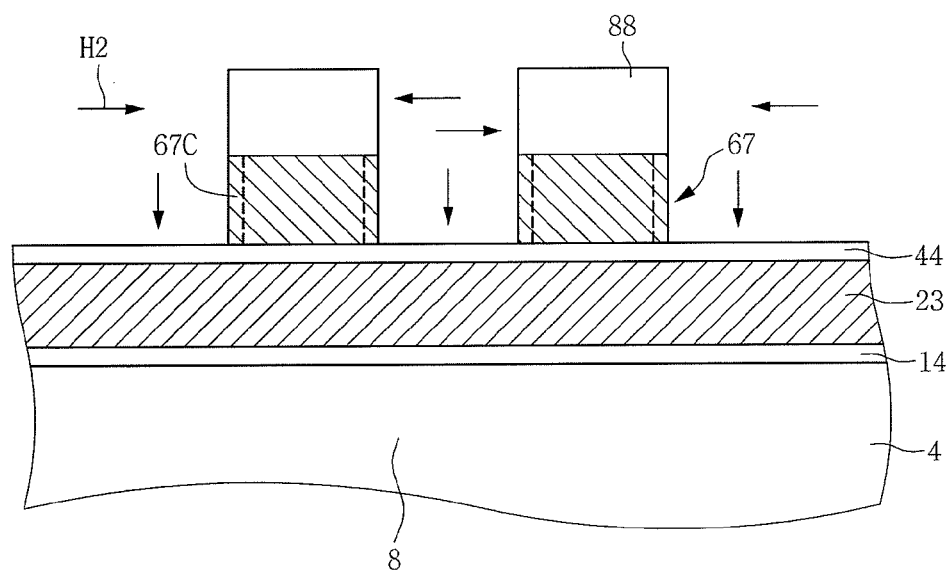

Referring to FIG. 6, a second recrystallization process may be performed to cure the second damaged regions 67A. The second recrystallization process may include, for example, the second heat treatment process H2. The second heat treatment process H2 may be performed by referring to the first heat treatment process H1. The second heat treatment process H2 may crystallize the second damaged regions 67A to form second recrystallized regions 67C.

Figure 7:
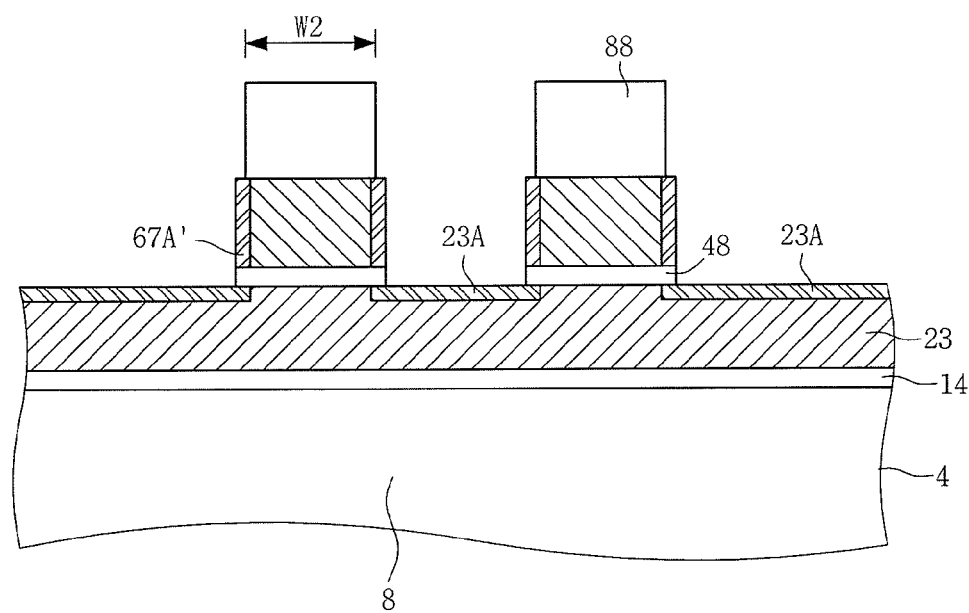

Referring to FIG. 7, the second insulating layer 44 may be patterned using, for example, the second conductive patterns 67 and the mask patterns 88 as an etch mask to form second insulating patterns 48. The patterning of the second insulating layer 44 may include, for example, partially removing the second insulating layer 44 using a third dry etching etchant. The third dry etching etchant includes a dry etching etchant for insulating material, for example, C, F and H, or C and F.

The second insulating patterns 48 may be vertically aligned with the second conductive patterns 67. A portion of mask patterns 88 may be partially removed to have a second width W2 less than the first width W1 during the etching of the second insulating layer 44. Third damaged regions 67A' may be formed on the sidewalls of the second conductive patterns 67. Fourth damaged regions 23A may be formed adjacent to a surface of the first conductive layer 23.

Figure 8:
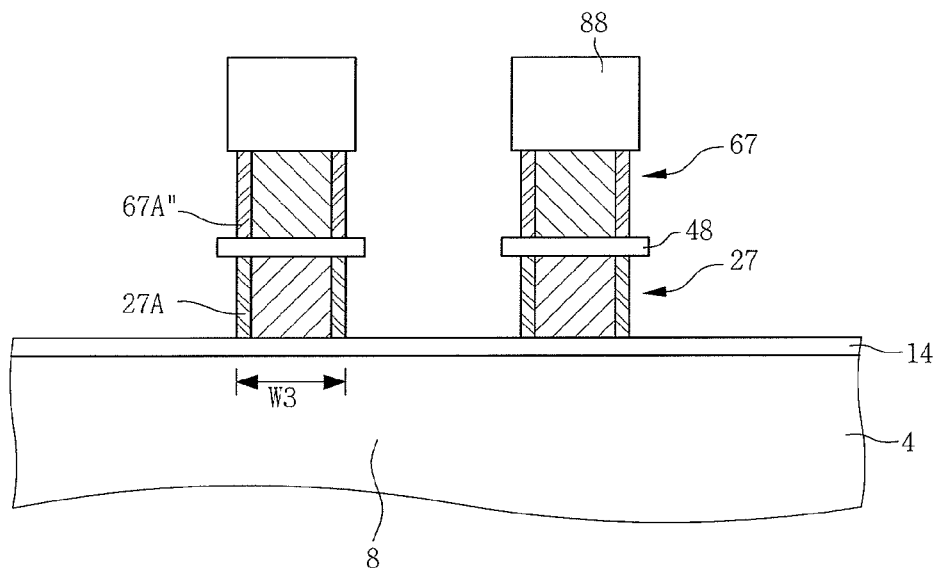

Referring to FIG. 8, the first conductive layer 23 may be patterned using, for example, the mask patterns 88 and the second insulating patterns 48 to form first conductive patterns 27. The patterning of the first conductive layer 23 may include, for example, partially removing the first conductive layer 23 using a fourth dry etching etchant. The fourth dry etching etchant may include, for example, a dry etching etchant for silicon, and the same gas as the second dry etching etchant.

A fifth damaged region 67A" may be formed on the sidewalls of the second conductive patterns 67. A sixth damaged region 27A may be formed on sidewalls of the first conductive patterns 27. The first conductive patterns 27 may have a third width W3.

Figure 9:
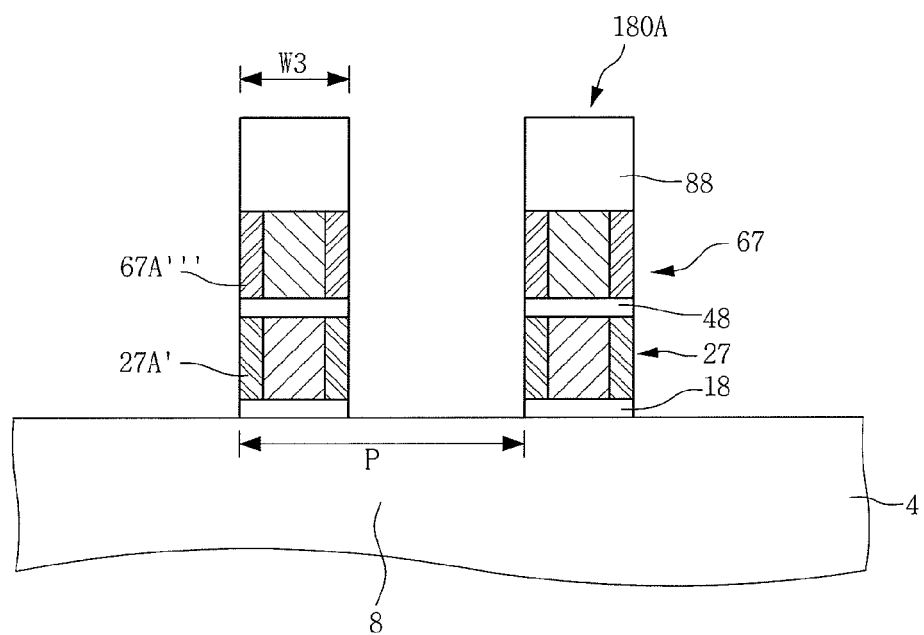

Referring to FIG. 9, the first insulating layer 14 may be patterned using, for example, the first conductive patterns 27, the second insulating patterns 48, the second conductive patterns 67 and the mask patterns 88 as an etch mask to foam first insulating patterns 18. The patterning of the first insulating layer 14 may include, for example, partially removing the first insulating layer 14 using a fifth dry etching etchant. The fifth dry etching etchant may include, for example, the first or third dry etching etchant.

A seventh damaged region 67A''' may be formed on the sidewalls of the second conductive patterns 67. The seventh damaged region 67A''' may be formed extending the fifth damaged region 67A" of FIG. 8. An eighth damaged region 27A' may be formed on the sidewalls of the first conductive patterns 27. The eighth damaged region 27A' may be formed extending the sixth damaged region 27A of FIG. 8.

In this case, the first insulating patterns 18, the first conductive patterns 27, the second insulating patterns 48, the second conductive patterns 67 and/or the mask patterns 88 may have the third width W3. For example, a selected first insulating pattern 18, a selected first conductive pattern 27, a selected second insulating pattern 48, a selected second conductive pattern 67 and/or a selected hard mask 88 may constitute a gate structure 180A. The gate structure 180A may be foamed in plurality. The plurality of gate structures 180A may be arranged at a predetermined pitch P on the semiconductor substrate 4 or the active region 8.

Figure 10:
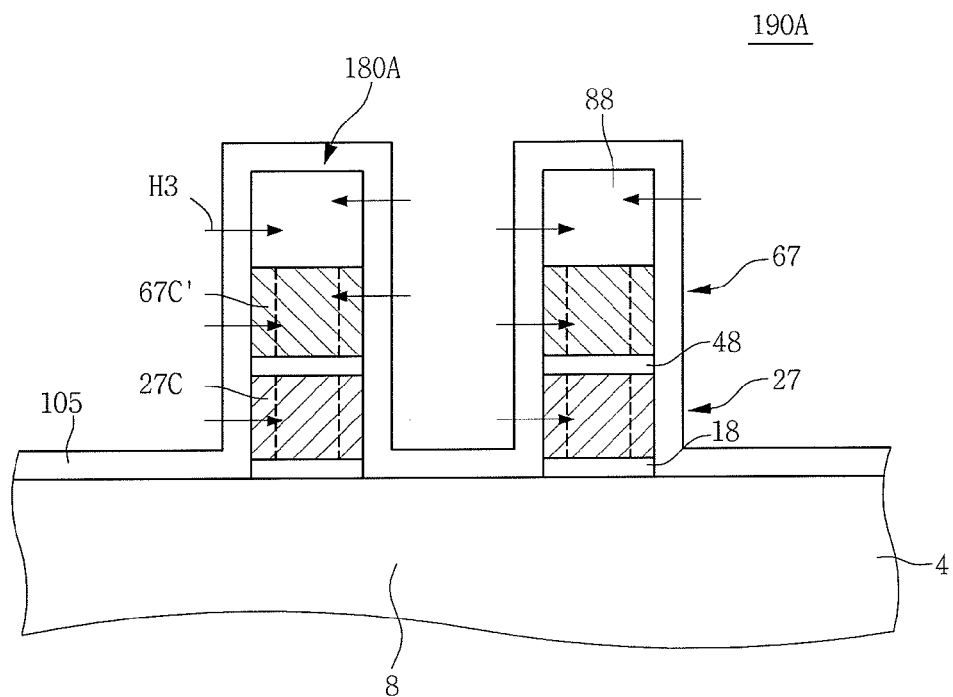

Referring to FIG. 10, a capping insulating layer 105 may be formed on the semiconductor substrate 4 and the gate structures 180A. The capping insulating layer 105 may include, for example, silicon oxide or silicon nitride. During the formation of the capping insulating layer 105, the seventh damaged region 67A''' and the eighth damaged region 27A' may be crystallized to form third recrystallized regions 67C' and fourth recrystallized regions 27C.

The process of forming the capping insulating layer 105 may include, for example, heating the gate structures 180A so as to make the damaged regions transform into the recrystallized regions. The process of forming the capping insulating layer 105 may include, for example, a third recrystallization process. The third recrystallization process may include, for example, performing a third heat treatment process H3 with respect to the semiconductor substrate 4 and the gate structures 180A.

The third heat treatment process H3 may include, for example, heating the seventh damaged regions 67A''' and the eighth damaged regions 27A' at a temperature of about 500° C. or higher. The third heat treatment process H3 may be performed by referring to the first or second heat treatment process H1 or H2. For example, the capping insulating layer 105 may constitute a semiconductor device 190A together with the semiconductor substrate 4 and the gate structures 180A. The semiconductor device 190A may include, for example, a flash memory device having a NAND structure.

FIGS. 11 to 15 are cross-sectional views taken along line I-I' of FIG. 1, illustrating a method of forming a semiconductor device according to an exemplary embodiment of the inventive concept. In FIGS. 11 to 15, the same reference numerals are used to denote the same elements as in FIGS. 2 through 10.

Figure 11:
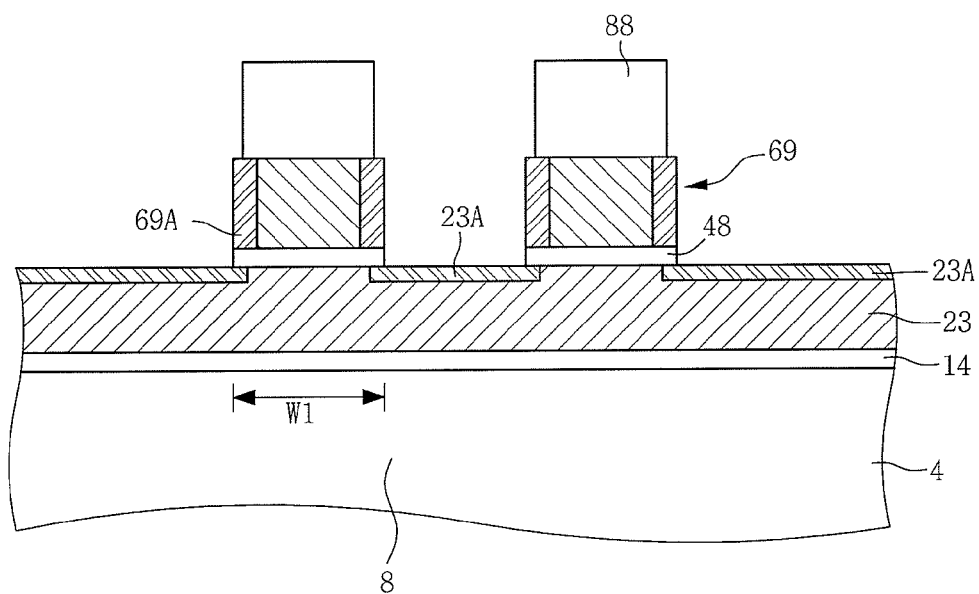
FIGS. 11 to 15 are cross-sectional views taken along line I-I' of FIG. 1, illustrating a method of foaming a semiconductor device according to an exemplary embodiment of the inventive concept.

Referring to FIG. 11, after performing the processes as shown in FIGS. 2 to 5, the second recrystallization process which includes the second heat treatment process H2 of FIG. 6 may be omitted. The patterning process of FIG. 7 may be performed. That is, after forming the second conductive patterns 69 using a second conductive layer 63 of FIG. 4, a second insulating layer 44 of FIG. 6 may be patterned to form second insulating patterns 48. First damaged regions 69A may be formed on sidewalls of the second conductive patterns 69.

A width of each of the first damaged regions 69A may be larger in size than that of each of the damaged regions 67A' of FIG. 7. This is because the first damaged regions 69A may be formed by omitting the second recrystallization process which includes the second heat treatment process H2 of FIG. 6. A second damaged region 23A may be formed adjacent to a surface of a first conductive layer 23 exposed between the second conductive patterns 69.

Figure 12:
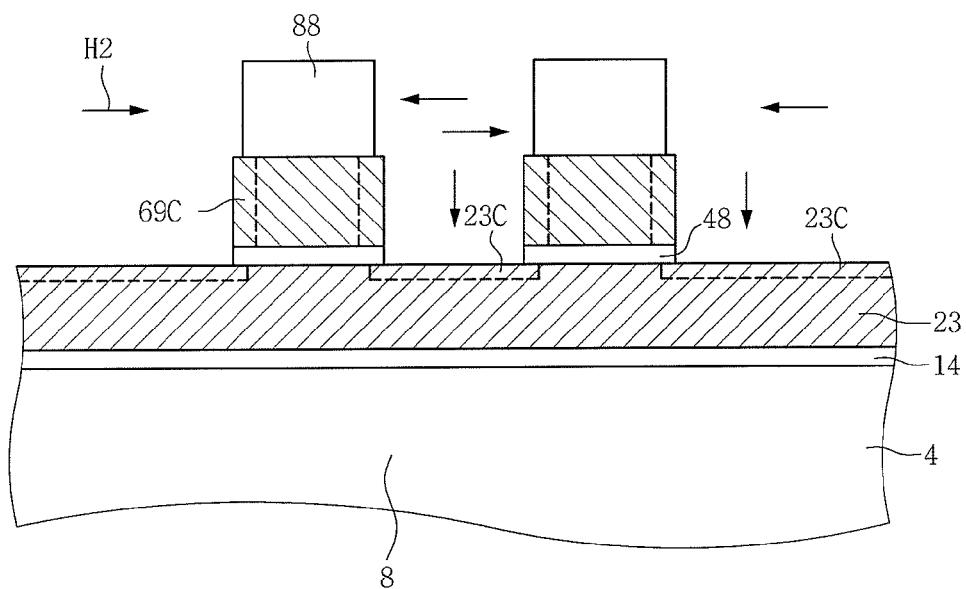

Referring to FIG. 12, after forming the second insulating patterns 48, a second recrystallization process may be performed to cure the first damaged regions 69A and the second damaged regions 23A. The second recrystallization process may crystallize the first damaged regions 69A and the second damaged regions 23A to form first recrystallized regions 69C and second recrystallized regions 23C, respectively. The second recrystallization process may include, for example, a second heat treatment process (H2).

Figure 13:
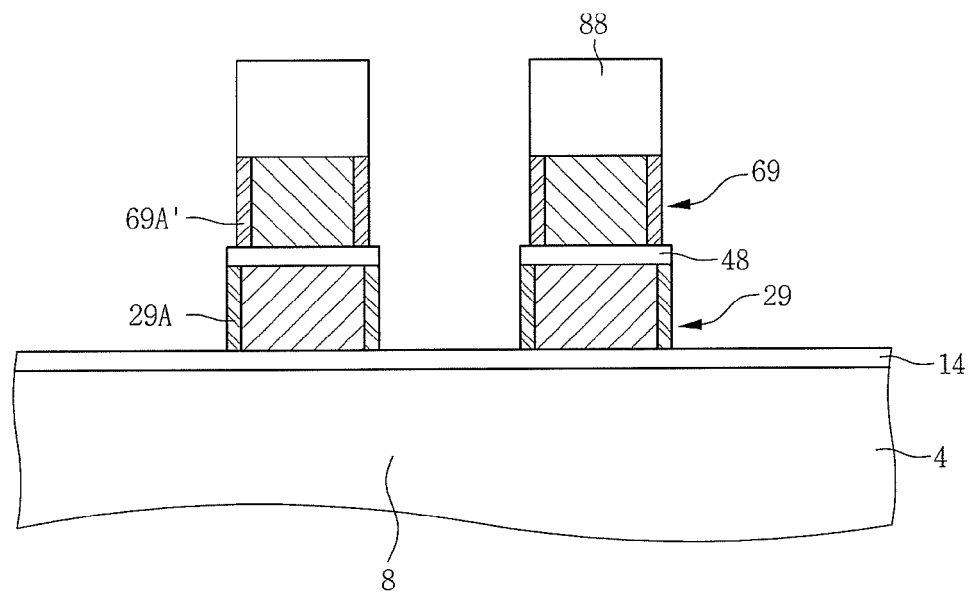

Referring to FIG. 13, the first conductive layer 23 may be patterned using, for example, the second insulating patterns 48 and the mask patterns 88 as an etch mask to form first conductive patterns 29. The patterning of the first conductive layer 23 may include, for example, partially removing the first conductive layer 23 using the fourth dry etching etchant of FIG. 8. Sidewalls of the first conductive patterns 29 may be vertically aligned with sidewalls of the second insulating patterns 48.

The sidewalls of the second conductive patterns 69 may be vertically aligned with sidewalls of the mask patterns 88. A third damaged region 69A' may be formed on the sidewalls of the second conductive patterns 69. A fourth damaged region 29A may be formed on the sidewalls of the first conductive patterns 29.

Figure 14:
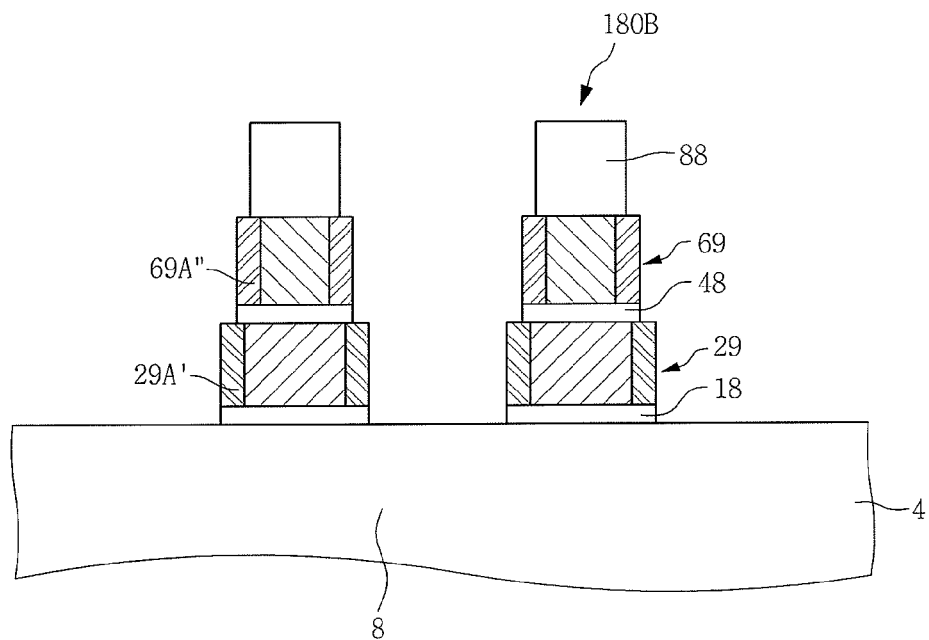

Referring to FIG. 14, a first insulating layer 14 may be patterned using, for example, the first conductive patterns 29, the second insulating patterns 48, the second conductive patterns 69 and the mask patterns 88 as an etch mask to form first insulating patterns 18. The patterning of the first insulating layer 14 may include, for example, partially removing the first insulating layer 14 using the fifth dry etching etchant of FIG. 9.

Sidewalls of the first insulating patterns 18 may be vertically aligned with the sidewalls of the first conductive patterns 29. The sidewalls of the second insulating patterns 48 may be vertically aligned with the sidewalls of the second conductive patterns 69. A fifth damaged region 69A" may be formed on the sidewalls of the second conductive patterns 69. The fifth damaged region 69K may be formed extending the third damaged region 69A' of FIG. 13.

A sixth damaged region 29N may be formed on the sidewalls of the first conductive patterns 29. The sixth damaged region 29A' may be formed extending the fourth damaged region 29A of FIG. 13. For example, a selected first insulating pattern 18, a selected first conductive pattern 29, a selected second insulating pattern 48, a selected conductive pattern 69 and/or a selected mask pattern 88 may constitute a gate structure 180B. The gate structure 180B may be formed in plurality on the semiconductor substrate 4.

Figure 15:
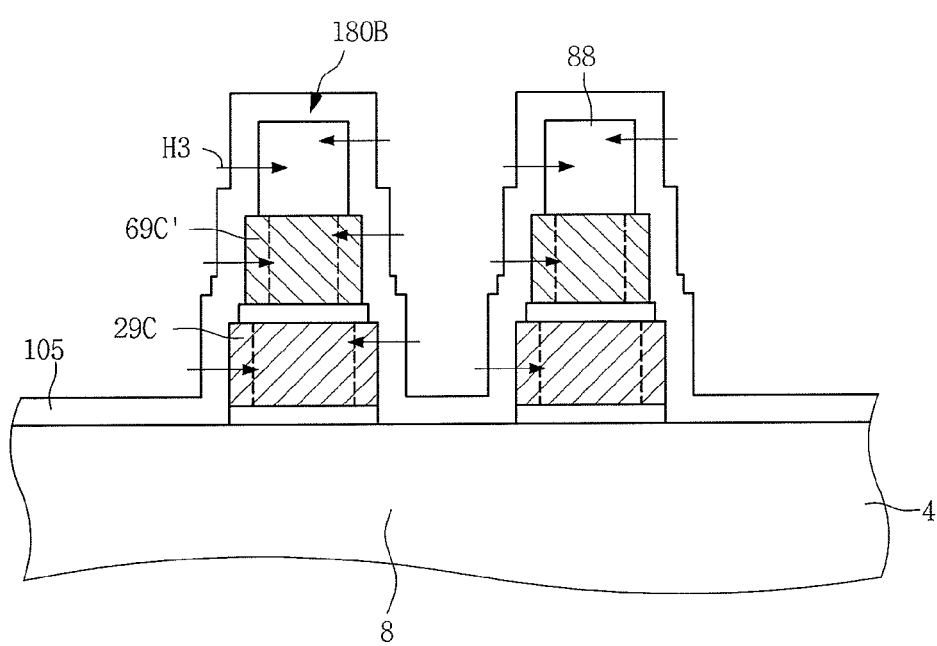

Referring to FIG. 15, a capping insulating layer 105 may be formed on the semiconductor substrate 4 and the gate structures 180B. The method and effect of forming the capping insulating layer 105 may be understood by referring to FIG. 10. Thus, during the formation of the capping insulating layer 105, the fifth damaged regions 69K may be crystallized to form a third recrystallized region 69C', and the sixth damaged region 29A' may be crystallized to form a fourth recrystallized region 29C.

The capping insulating layer 105 may constitute a semiconductor device 190B together with the semiconductor substrate 4 and the gate structures 180B. The semiconductor device 190B may include, for example, a flash memory device having a NAND structure.

Figure 16:
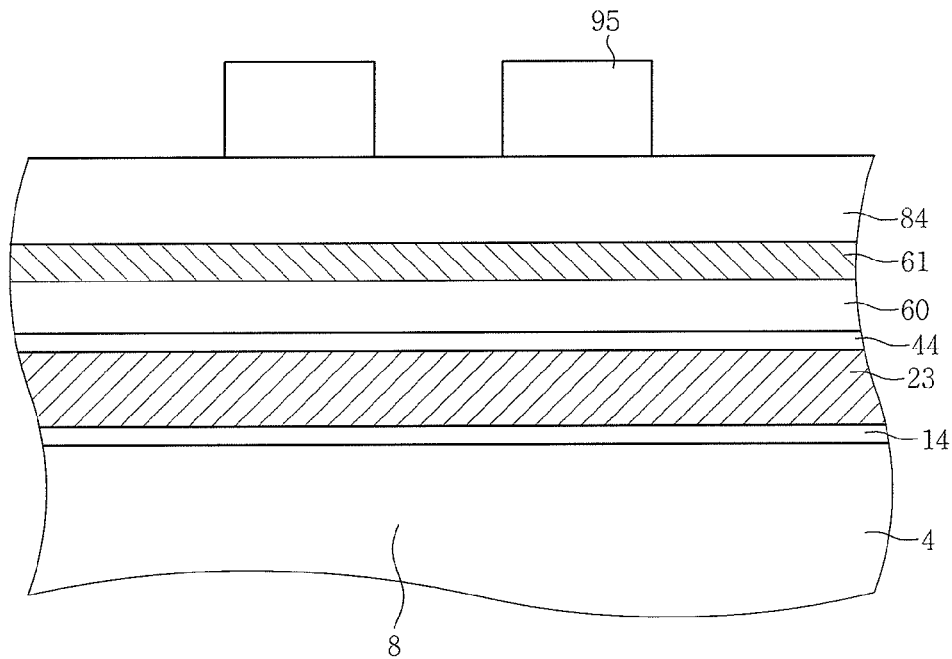
FIGS. 16 to 18 are cross-sectional views taken along line I-I' of FIG. 1, illustrating a method of forming a semiconductor device according to an exemplary embodiment of the inventive concept.
Figure 17:
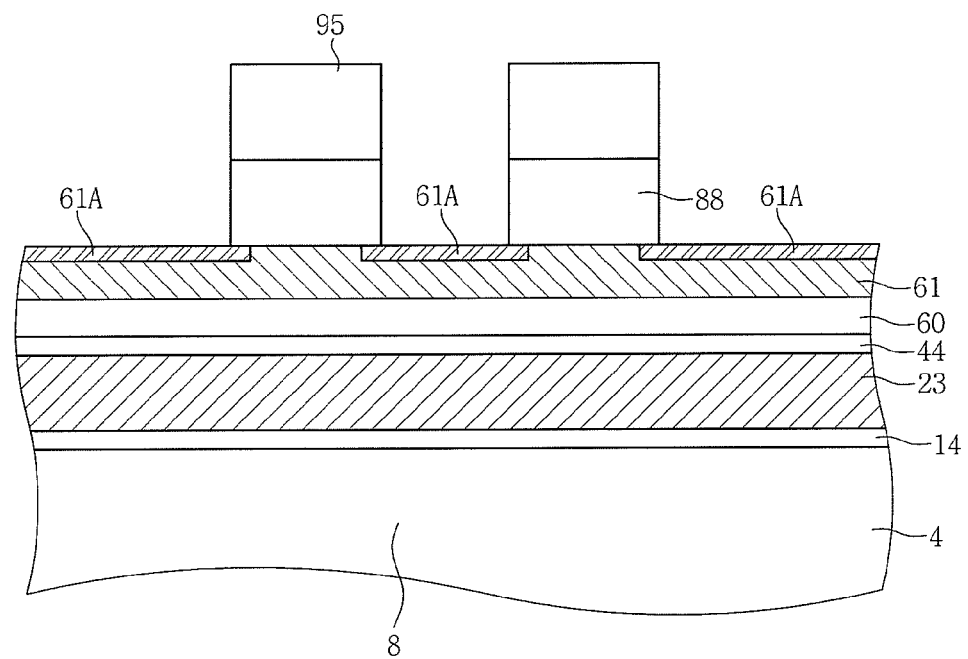
Figure 18:
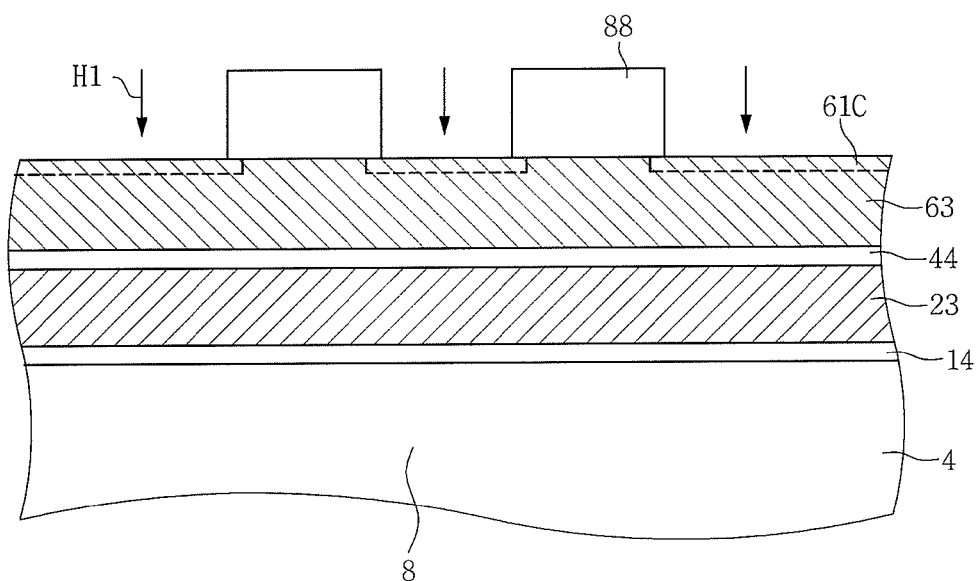

FIGS. 16 to 18 are cross-sectional views taken along line I-I' of FIG. 1, illustrating a method of forming a semiconductor device according to an exemplary embodiment of the inventive concept. In FIGS. 16 to 18, the same reference numerals are used to denote the same elements as in FIGS. 2 through 10.

Referring to FIG. 16, a first insulating layer 14, a first conductive layer 23, a second insulating layer 44, an undoped silicon layer 60, and a doped silicon layer 61 may be sequentially formed on a semiconductor substrate 4. The first conductive layer 23 may include, for example, polycrystalline silicon. Alternatively, the undoped silicon layer 60 may be formed on the doped silicon layer 61.

Each of the undoped silicon layer 60 and the doped silicon layer 61 may include, for example, a polycrystalline structure. A mask layer 84 and photoresist patterns 95 may be sequentially formed on the doped silicon layer 61.

Referring to FIG. 17, the mask layer 84 may be patterned using, for example, the photoresist patterns 95 as an etch mask to form mask patterns 88. The patterning of the mask layer 84 may include, for example, partially removing the mask layer 84 using a first dry etching etchant of FIG. 3. In the case, first damaged regions 61A may be formed adjacent to a surface of the doped silicon layer 61.

Referring to FIG. 18, the photoresist patterns 95 may be removed from the semiconductor substrate 4. Subsequently, a process may be performed to cure the first damaged regions 61A. For example, a first recrystallization process may be performed to crystallize the first damaged regions 61A. The first recrystallization process may include, for example, a first heat treatment process H1. The first recrystallization process may crystallize the first damaged regions 61A to form recrystallized regions 61C.

In this case, dopants of the doped silicon layer 61 may be diffused to the undoped silicon layer 60. Thus, the undoped silicon layer 60 and the doped silicon layer 61 may be formed as a second conductive layer 63. Subsequently, the remaining processes may be performed by referring to FIGS. 5 to 10, or to FIGS. 11 to 15.

FIGS. 19 to 25 are cross-sectional views taken along line I-I' of FIG. 1, illustrating a method of forming a semiconductor device according to an exemplary embodiment of the inventive concept. In FIGS. 19 to 25, the same reference numerals are used to denote the same elements as in FIGS. 2 through 10.

Figure 19:
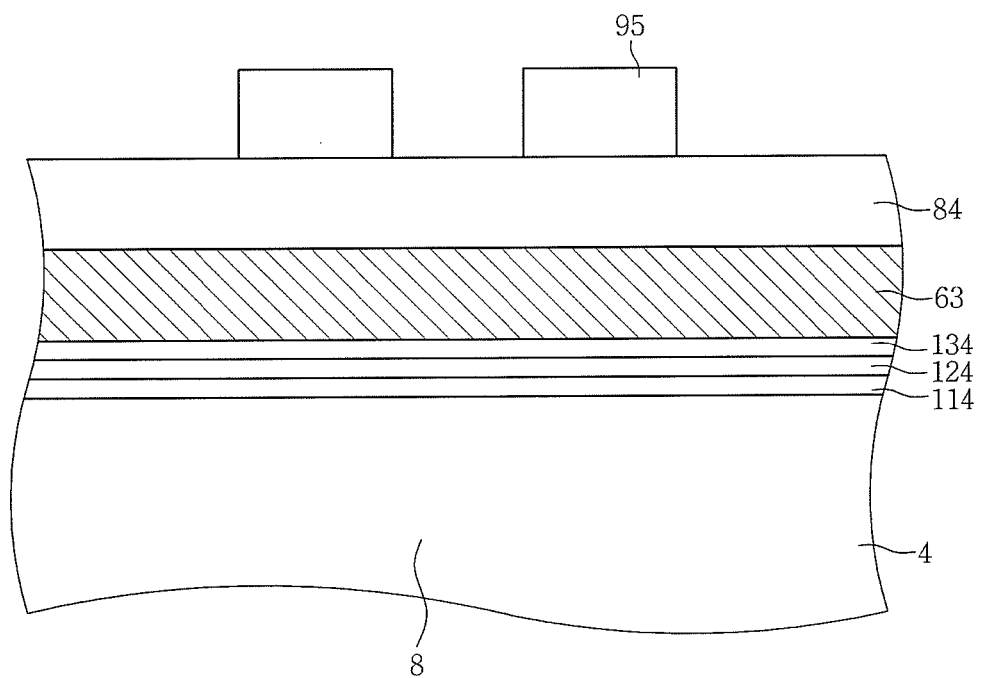
FIGS. 19 to 25 are cross-sectional views taken along line I-I' of FIG. 1, illustrating a method of forming a semiconductor device according to an exemplary embodiment of the inventive concept.

Referring to FIG. 19, first to third insulating layers 114, 124 and 134, a conductive layer 63 and a mask layer 84 may be sequentially formed on a semiconductor substrate 4. The first insulating layer 114 may include, for example, silicon oxide. The second insulating layer 124 may include, for example, silicon nitride. The third insulating layer 134 may include, for example, silicon oxide. Photoresist patterns 95 may be formed on the mask layer 84.

Figure 20:
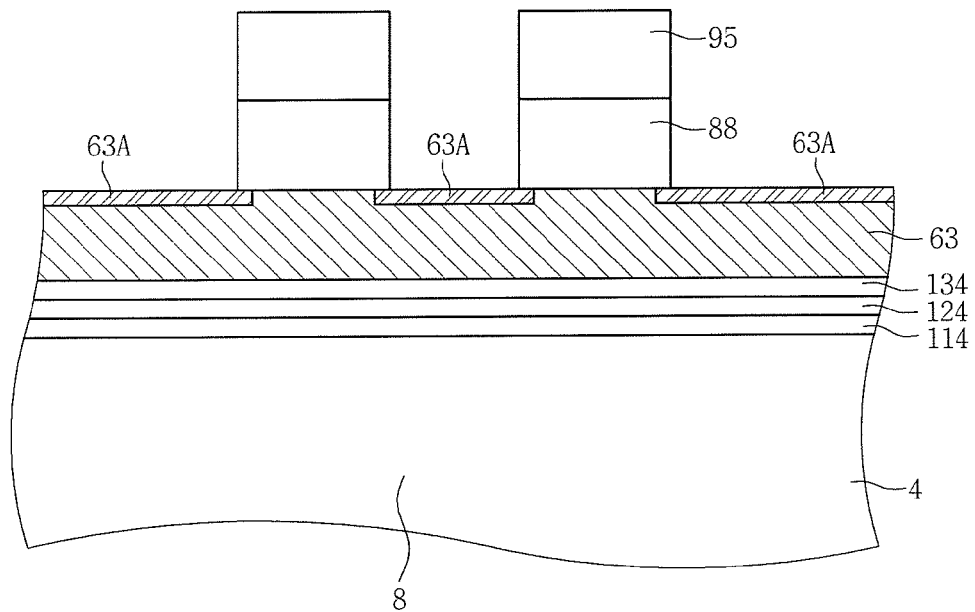

Referring to FIG. 20, the mask layer 84 may be patterned using, for example, the photoresist patterns 95 as an etch mask to form mask patterns 88. The patterning of the mask layer 84 may include, for example, partially removing the mask layer 84 using a first dry etching etchant of FIG. 3. In this case, first damaged regions 63A may be formed adjacent to a surface of the conductive layer 63.

Figure 21:
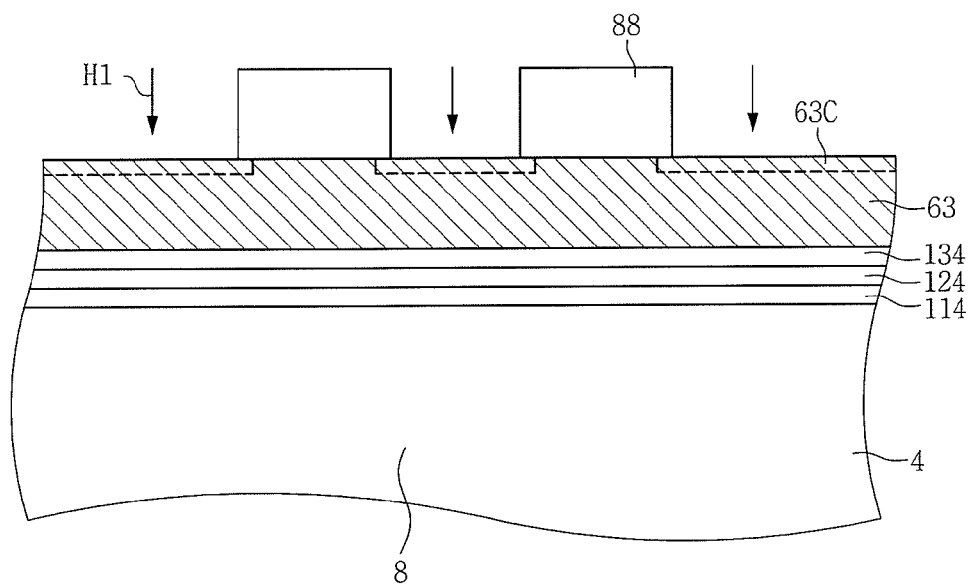

Referring to FIG. 21, after forming the mask patterns 88, the photoresist patterns 95 may be removed from the semiconductor substrate 4. A process may be performed to cure the first damaged regions 63A. For example, a first recrystallization process may be performed to crystallize the first damaged regions 63A. The first recrystallization process may include, for example, a first heat treatment process H1. The first recrystallization process may crystallize the first damaged regions 63A to form first recrystallized regions 63C.

Figure 22:
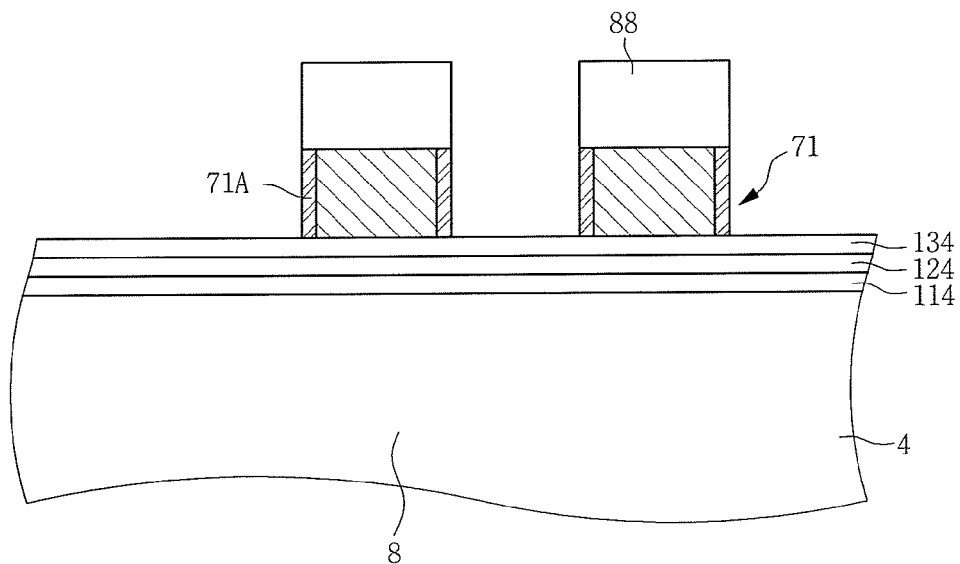

Referring to FIG. 22, the conductive layer 63 may be patterned using, for example, the mask patterns 88 as an etch mask to form conductive patterns 71. The patterning of the conductive layer 63 may include, for example, partially removing the conductive layer 63 using the second dry etching etchant of FIG. 5. Second damaged regions 71A may be formed on sidewalls of the conductive patterns 71.

Figure 23:
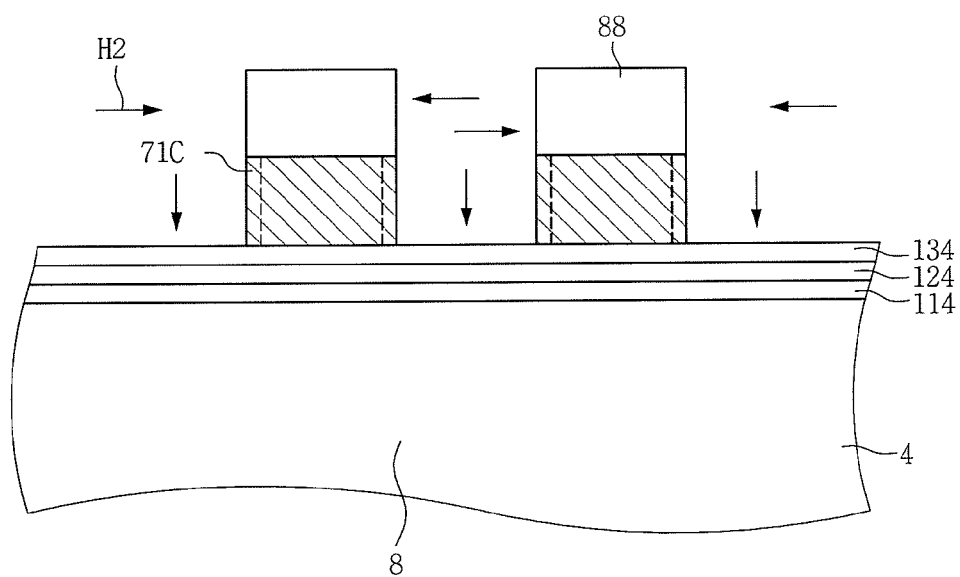

Referring to FIG. 23, a process may be performed to cure the second damaged regions 71A. For example, a second recrystallization process may be performed to crystallize the second damaged regions 71A. The second recrystallization process may include, for example, a second heat treatment process H2. The second recrystallization process may crystallize the second damaged regions 71A to form second recrystallized regions 71C.

Figure 24:
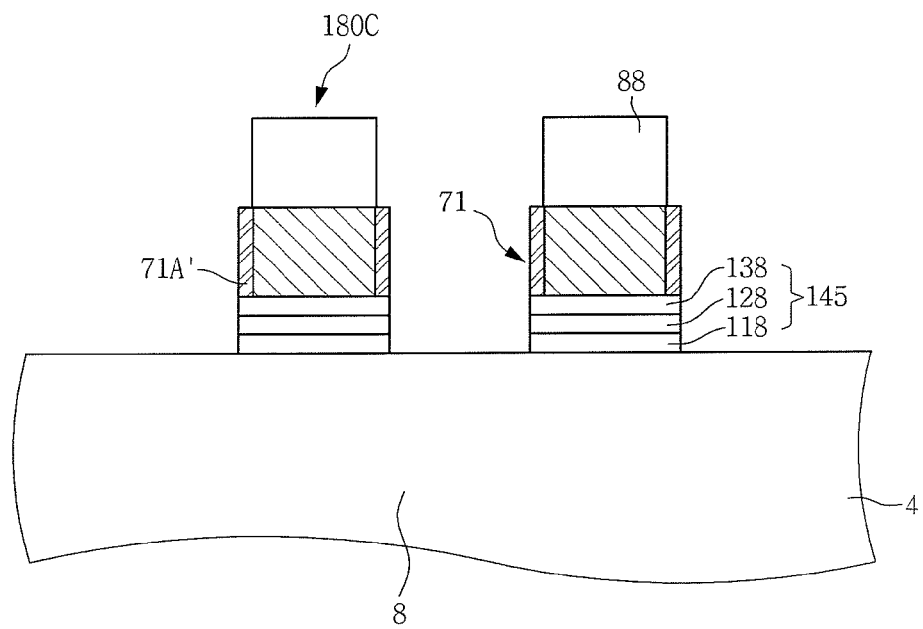

Referring to FIG. 24, the first to third insulating layers 114, 124 and 134 may be patterned using, for example, the mask patterns 88 and the conductive patterns 71 to form an insulating pattern 145. The insulating pattern 145 may include the first to third insulating patterns 118, 128 and 138. The patterning of the first to third insulating layers 114, 124 and 134 may include, for example, partially removing the first to third insulating layers 114, 124 and 134 using a third dry etching etchant of FIG. 7.

The third dry etching etchant may partially remove the mask patterns 88. Third damaged regions 71N may be formed on the sidewalls of the conductive patterns 71. For example, in this case, a selected insulating pattern 145, a selected conductive pattern 71 and/or a selected mask pattern 88 may constitute a gate structure 180C. The gate structure 180C may be formed in plurality on the semiconductor substrate 4 or an active region 8.

Figure 25:
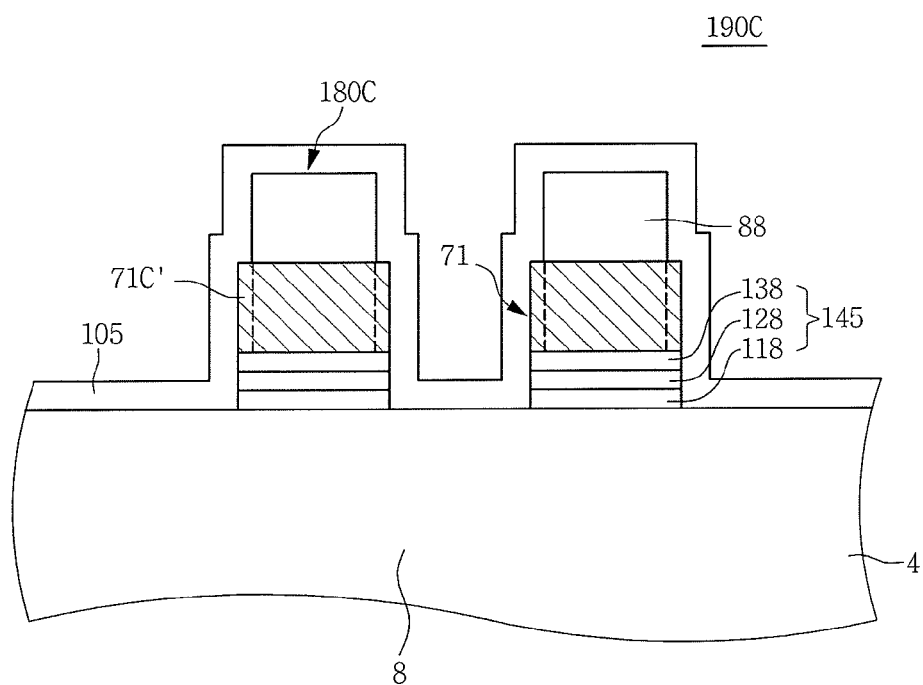

Referring to FIG. 25, a capping insulating layer 105 may be formed on the semiconductor substrate 4, the conductive patterns 71, the mask patterns 88 and/or the insulating patterns 145. The method and effect of forming the capping insulating layer 105 may be understood by referring to FIG. 10. During the formation of the capping insulating layer 105, the third damaged regions 71N may be crystallized to form third recrystallized regions 71C'.

The capping insulating layer 105 may constitute a semiconductor device 190C together with the semiconductor substrate 4 and the gate structure 180C. The semiconductor device 190C may include, for example, a flash memory device having a Silicon-Oxide-Nitride-Oxide-Silicon (SONOS) structure.

Figure 26:
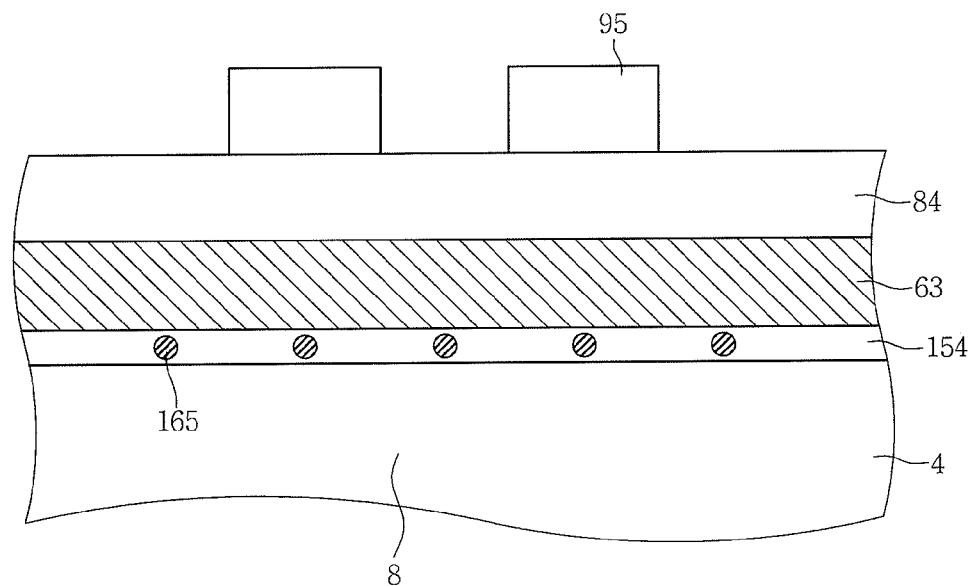
FIGS. 26 and 27 are cross-sectional views taken along line I-I' of FIG. 1, illustrating a method of forming a semiconductor device according to an exemplary embodiment of the inventive concept.
Figure 27:
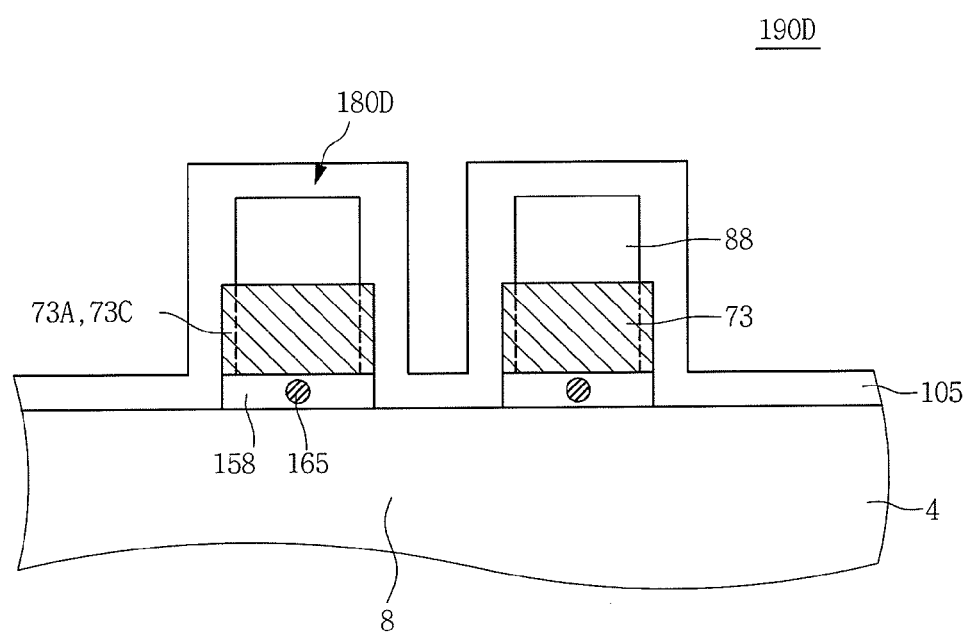

FIGS. 26 and 27 are cross-sectional views taken along line I-I' of FIG. 1, illustrating a method of forming a semiconductor device according to an exemplary embodiment of the inventive concept. In FIGS. 26 to 27, the same reference numerals are used to denote the same elements as in FIGS. 2 through 10.

Referring to FIG. 26, an insulating layer 154 may be formed on a semiconductor substrate 4. The insulating layer 154 may include, for example, a quantum trap layer or quantum trap sites having quantum dots 165. The insulating layer 154 or each of the quantum dots 165 includes, for example, a metal or metal compound. A conductive layer 63 and a mask layer 84 may be sequentially formed on the insulating layer 154. Photoresist patterns 95 may be formed on the mask layer 84.

Referring to FIG. 27, the conductive layer 63, the mask layer 84 and the insulating layer 154 may be patterned using, for example, the semiconductor substrate 4 as an etch buffer layer to form conductive patterns 73, mask patterns 88 and insulating patterns 158. Damaged regions 73A may be formed on sidewalls of the conductive patterns 73. The conductive patterns 73, the mask patterns 88 and the insulating patterns 158 may together constitute a gate structure 180D.

After the forming the gate structure 180D, the photoresist patterns 95 may be removed from the semiconductor substrate 4. Subsequently, a capping insulating layer 105 may be formed on the semiconductor substrate 4, the conductive patterns 73, the mask patterns 88 and the insulating patterns 158. The process of forming the capping insulating layer 105 may include, for example, applying heat to the gate structure 180D so as to transform the damaged regions into the recrystallized regions. Thus, during the formation of the capping insulating layer 105, the damaged regions 73A may be crystallized to transform the damaged regions 73A into recrystallized regions 73C.

The capping insulating layer 105 may constitute a semiconductor device 190D together with the semiconductor substrate 4 and the gate structure 180D. The semiconductor device 190D may include, for example, a nano-floating gate (NFG) memory device.

Figure 28:
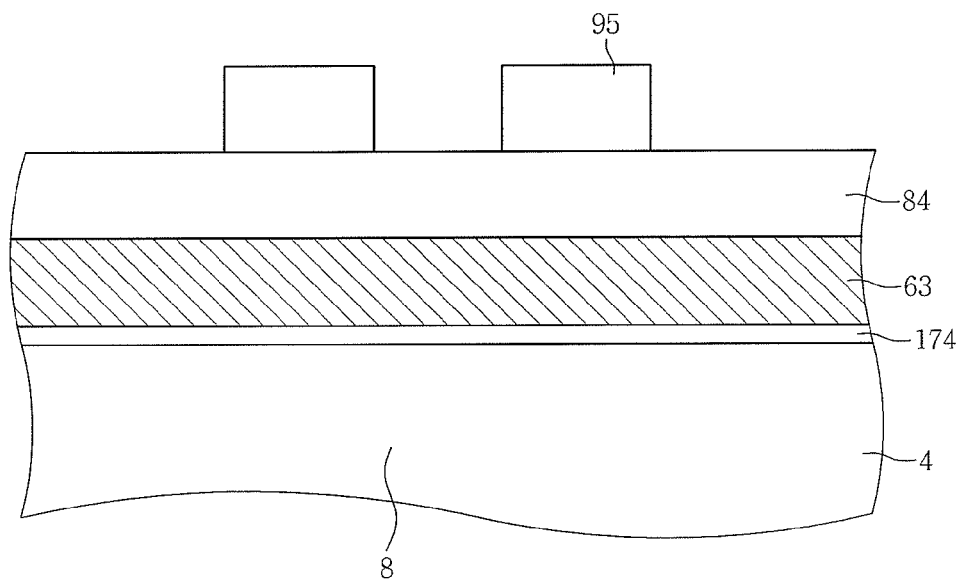
FIGS. 28 and 29 are cross-sectional views taken along line I-I' of FIG. 1, illustrating a method of forming a semiconductor device according to an exemplary embodiment of the inventive concept.
Figure 29:
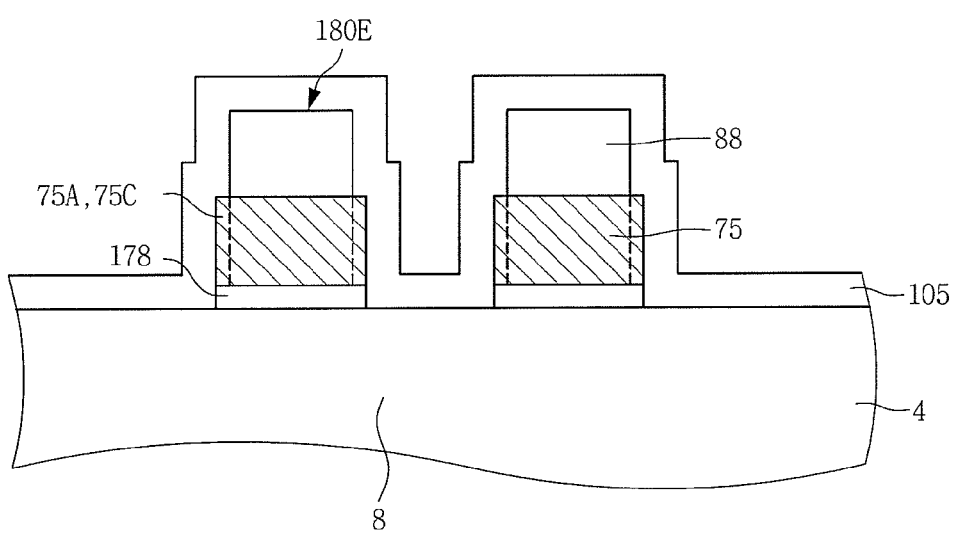

FIGS. 28 and 29 are cross-sectional views taken along line I-I' of FIG. 1, illustrating a method of forming a semiconductor device according to an exemplary embodiment of the inventive concept. In FIGS. 28 to 29, the same reference numerals are used to denote the same elements as in FIGS. 2 through 10.

Referring to FIG. 28, an insulating layer 174 may be formed on a semiconductor substrate 4. The insulating layer 174 may include, for example, the same material as a first insulating layer 14 of FIG. 2. A conductive layer 63 and a mask layer 84 may be sequentially formed on the insulating layer 174. Photoresist patterns 95 may be formed on the mask layer 84.

Referring to FIG. 29, the conductive layer 63, the mask layer 84 and the insulating layer 174 may be patterned using, for example, the semiconductor substrate 4 as an etch buffer layer to form conductive patterns 75, mask patterns 88 and insulating patterns 178. In this case, damaged regions 75A may be formed on sidewalls of the conductive patterns 75. The conductive patterns 75, the mask patterns 88 and the insulating patterns 178 may together constitute a gate structure 180E.

After forming the gate structure 180E, the photoresist patterns 95 may be removed from the semiconductor substrate 4. Subsequently, a capping insulating layer 105 may be formed on the semiconductor substrate 4, the conductive patterns 75, the mask patterns 88 and the insulating patterns 178. The process of forming the capping insulating layer 105 may include, for example, applying heat to the gate structure 180E so as to make the damaged regions transform into the recrystallized regions. Thus, during the formation of the capping insulating layer 105, the damaged regions 75A may be crystallized and transformed into recrystallized regions 75C.

The capping insulating layer 105 may constitute a semiconductor device 190E together with the semiconductor substrate 4 and the gate structure 180E. The semiconductor device 190E may include a volatile memory device (DRAM or SRAM).

Figure 30:
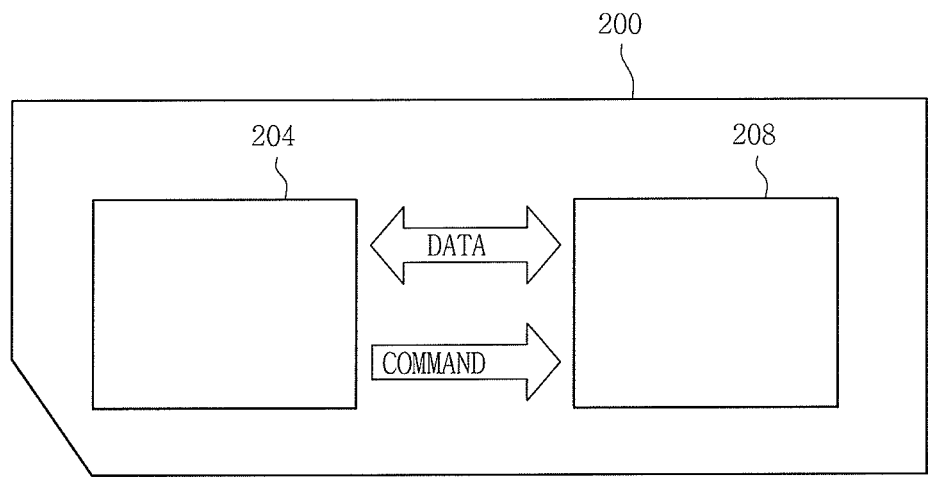
FIG. 30 is a block diagram showing an information storage medium including the semiconductor device of FIG. 1.

FIG. 30 is a block diagram showing an information storage medium including a semiconductor device of FIG. 1 fabricated by the methods of an exemplary embodiment of the inventive concept.

Referring to FIG. 30, a memory information medium 200 may include, for example, a controller 204 and a memory 208. The controller 204 may control the memory 208. Through a command of the controller 204, the controller 204 and the memory 208 may exchange electric signals from each other. The memory information medium 200 may store data in the memory 208, or read data from the memory 208.

The memory 208 may include the memory device 190 of FIG. 1 fabricated by the methods of the embodiments. The memory information medium 200 may include, for example, a multimedia card or a secure digital card.

Figure 31:
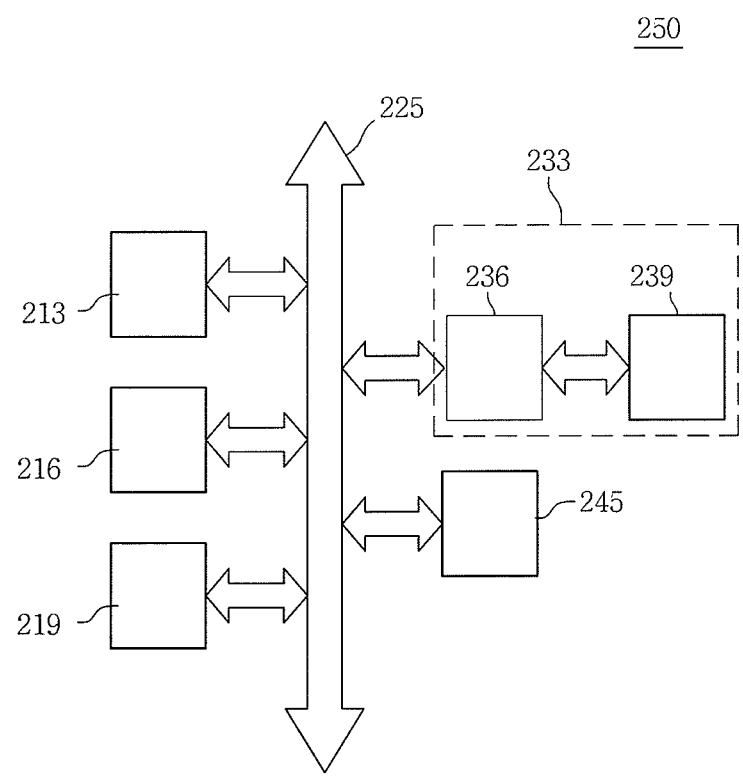
FIG. 31 is a block diagram showing an information processing system including the semiconductor device of FIG. 1.

FIG. 31 is a block diagram showing an information processing system including a semiconductor device of FIG. 1 fabricated by the methods of an exemplary embodiment of the inventive concept.

Referring to FIG. 31, an information processing system 250 may be prepared. The information processing system 250 may include, for example, a flash memory system 233. The flash memory system 233 may include, for example, a memory controller 236 and a flash memory device 239. The flash memory device 239 may include a semiconductor device 190 of FIG. 1 fabricated by the methods of the embodiments. The memory controller 236 may electrically connect the flash memory device 239.

The information processing system 250 may further include, for example, a central processing unit (CPU) 213, a random access memory (RAM) 216, a user interface 219 and a modem 245. The CPU 213, the RAM 216, the user interface 219 and the modem 245 may electrically connect the flash memory system 233 through, for example, a bus line 225. In this case, the RAM 216 may include a semiconductor device 190 of FIG. 1.

Figure 32:
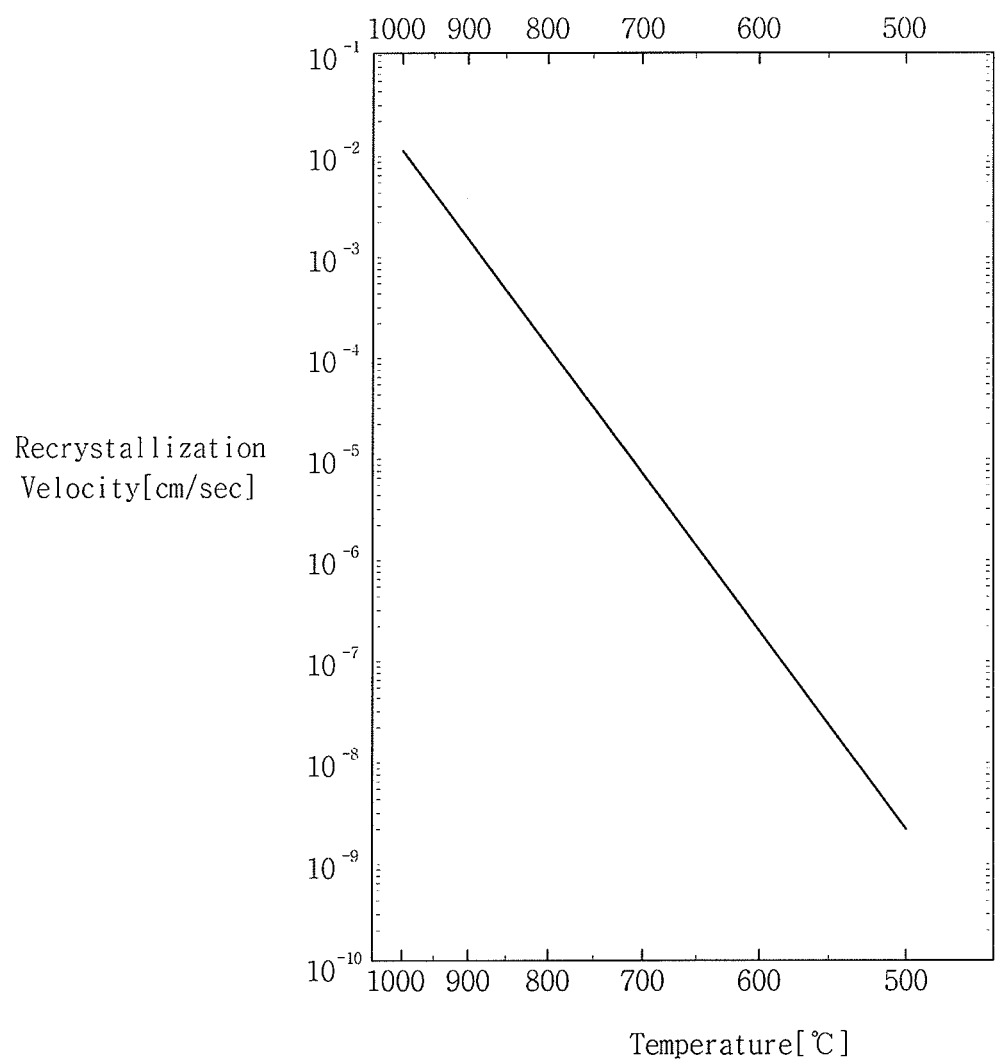
FIG. 32 is a graph showing an experimental result of recrystallization velocity characteristics to recrystallization process temperatures.

FIG. 32 is a graph showing an experimental result of recrystallization velocity characteristics to recrystallization process temperatures.

Referring to FIG. 32, a graph may be prepared. An X axis of the graph may correspond to a temperature (° C.) of a recrystallization process. A Y axis of the graph may correspond to a recrystallization velocity of a damaged region in a conductive pattern. The experiment result is indicated in a straight line by adjusting a temperature interval in the X axis thereof. In this case, the graph shows that the recrystallization velocity is proportionate to a temperature of a recrystallization process. According to the graph, as the temperature of the recrystallization process is higher, the recrystallization velocity of the damaged region in the conductive pattern becomes increasingly faster.

When the recrystallization process is performed at a temperature of lower than 500° C., a full throughput is not expected to cure the damaged region of the conductive pattern. When the recrystallization process is performed at a temperature of higher than 1000° C., the full throughput may be expected to cure the damaged region of the conductive pattern for a short time. According to the graph, the recrystallization process may have a recrystallization velocity of 10 nm/sec at a temperature of about 550° C.

Thus, when the recrystallization process is performed at a temperature of higher than 500° C., a desired recrystallization velocity may be obtained within several seconds. However, because this temperature and time are lower limitations in the graph, the recrystallization process may be performed at higher than 500° C. for above several seconds so as to stably recrystallize the damaged region.

An optimum recipe for the recrystallization process was searched from a recipe performed at about 500° C. for about 30 seconds, to a recipe performed at about 1000° C. for about 5 seconds. In this case, the optimum recipe existed between the recipes and was confirmed as being able to apply to the semiconductor device of FIG. 1. It may fully be understood that embodiments of the inventive concept are variably applied to other semiconductor devices than the semiconductor device of FIG. 1, or according to a kind and a characteristic of conductive material.

The recrystallization process of curing the damaged regions may be performed under, for example, an inert gas atmosphere. The inert gas may include, for example, one selected from nitrogen ($N_2$), helium (He), neon (Ne), argon (Ar), krypton (Kr), xenon (Xe), radon (Rn) and ununoctium (Uuo). The recrystallization process may be performed under an atmosphere not including $O_2$. This is because the $O_2$ may react with the conductive pattern to form an oxide layer in the damaged region of the conductive pattern.

The recrystallization process may be performed in, for example, a vacuum tube or a vacuum chamber. The vacuum tube may be used in, for example, diffusion annealing technology. The vacuum chamber may be used in, for example, rapid thermal annealing technology. The recrystallization process may use, for example, a polycrystalline silicon layer or a polycrystalline silicon pattern as a crystalline seed to transform an amorphous region into a recrystallized region.

As a result, a semiconductor device according to embodiments of the inventive concept may have a desired profile and a uniformly electric resistance suitable for a design rule of the semiconductor device. An information storage medium and an information processing system including the semiconductor device may have an electrically increased characteristic and an electrically increased performance.

Having described exemplary embodiments of the inventive concept, it is further noted that it is readily apparent to those of reasonable skill in the art that various modifications may be made without departing from the spirit and scope of the invention which is defined by the metes and bounds of the appended claims.

What is claimed is:

1. A method of forming a semiconductor device, comprising:
    forming a first insulating layer on a semiconductor substrate;
    forming a first polycrystalline silicon layer on the first insulating layer;
    forming a second insulating layer on the first polycrystalline silicon layer;
    forming a second polycrystalline silicon layer on the second insulating layer;
    forming a mask pattern on the second polycrystalline silicon layer;
    patterning the second polycrystalline silicon layer using the mask pattern as an etch mask to form a second polycrystalline silicon pattern exposing a portion of the second insulating layer, wherein a first amorphous region is formed on a sidewall of the second polycrystalline silicon pattern;
    crystallizing the first amorphous region using a first recrystallization process;
    removing the exposed portion of the second insulating layer to form a second insulating pattern exposing a portion of the first polycrystalline silicon layer;
    removing the exposed portion of the first polycrystalline silicon layer to form a first polycrystalline silicon pattern exposing a portion of the first insulating layer; and
    removing the exposed portion of the first insulating layer to form a first insulating pattern exposing a portion of the semiconductor substrate,
    wherein the forming of the first insulating pattern or the second insulating pattern comprises dry-etching the first insulating layer or the second insulating layer using a gas including carbon and fluorine.

2. The method of claim 1, wherein the semiconductor substrate comprises single crystalline silicon, and the first insulating layer comprises at least one of silicon oxide and a metal oxide.

3. The method of claim 1, wherein the second insulating layer comprises at least one of silicon nitride and a metal oxide.

4. The method of claim 3, wherein the second insulating layer further comprises silicon oxide.

5. The method of claim 1, wherein the mask pattern comprises at least one selected from the group consisting of silicon oxide, silicon nitride, and silicon oxynitride.

6. The method of claim 1, wherein the forming of the mask pattern comprises:
    forming a mask layer on the second polycrystalline silicon layer;
    forming a photoresist pattern on the mask layer;

dry-etching the mask layer using the photoresist pattern as an etch mask under an atmosphere of a gas including carbon and fluorine; and removing the photoresist pattern from the semiconductor substrate.

7. The method of claim 1, wherein the forming of the first polycrystalline silicon pattern or the second polycrystalline silicon pattern comprises dry-etching the first polycrystalline silicon layer or the second polycrystalline silicon layer using a gas including hydrogen bromide (HBr).

8. The method of claim of claim 1, wherein the forming of the first insulating pattern or the second insulating pattern comprises dry-etching the first insulating layer or the second insulating layer using a gas including carbon, fluorine and hydrogen.

9. The method of claim 1, wherein the first recrystallization process is performed at a temperature of at least about 500° C.

10. The method of claim 9, wherein the first recrystallization process is performed for about 5 seconds to about 30 seconds.

11. The method of claim 1, wherein the first recrystallization process is performed under an inert gas atmosphere.

12. The method of claim 1, further comprising, after forming the second insulating pattern, performing a second recrystallization process.

13. The method of claim 1, further comprising, after foaming the first insulating pattern, performing a third recrystallization process.

14. The method of claim 13, wherein the third recrystallization process comprises forming a capping insulating layer, wherein the capping insulating layer covers the semiconductor substrate, the first insulating pattern, the first polycrystalline silicon pattern, the second insulating pattern, and the second polycrystalline silicon pattern.

15. The method of claim 14, wherein the capping insulating layer comprises silicon oxide.

16. A method of forming a semiconductor device, comprising:
    forming a first insulating layer on a semiconductor substrate;
    forming a first polycrystalline silicon layer on the first insulating layer;
    forming a second insulating layer on the first polycrystalline silicon layer;
    forming a second polycrystalline silicon layer on the second insulating layer;
    forming a mask pattern on the second polycrystalline silicon layer;
    patterning the second polycrystalline silicon layer using the mask pattern as an etch mask to form a second polycrystalline silicon pattern exposing a portion of the second insulating layer;
    removing the exposed portion of the second insulating layer to form a second insulating pattern exposing a portion of the first polycrystalline silicon layer, wherein amorphous regions are formed on a sidewall of the second polycrystalline silicon pattern and the exposed portion of the first polycrystalline silicon layer;
    crystallizing the amorphous regions on the sidewall of the second polycrystalline silicon pattern and the exposed portion of the first polycrystalline silicon layer using a recrystallization process;
    removing the exposed portion of the first polycrystalline silicon layer to form a first polycrystalline silicon pattern exposing a portion of the first insulating layer; and
    removing the exposed portion of the first insulating layer to form a first insulating pattern exposing a portion of the semiconductor substrate,
    wherein the forming of the first insulating pattern or the second insulating pattern comprises dry-etching the first insulating layer or the second insulating layer using a gas including carbon and fluorine.

17. A method of forming a semiconductor device, comprising:
    forming an insulating layer on a semiconductor substrate, wherein the insulating layer includes a quantum trap layer or a quantum trap site having a quantum dot and wherein the insulating layer or the quantum dot includes a metal or a metal compound;
    forming a conductive layer on the insulating layer;
    forming a mask layer on the conductive layer;
    forming a photoresist pattern on the mask layer;
    patterning the conductive layer, the mask layer and the insulating layer using the semiconductor substrate as an etch buffer layer to form a conductive pattern, a mask pattern and an insulating pattern on the semiconductor substrate, wherein the conductive pattern, the mask pattern and the insulating pattern together constitute a gate structure;
    removing the photoresist pattern from the semiconductor substrate after forming the gate structure; and
    forming a capping insulating layer on the semiconductor substrate, the conductive pattern, the mask pattern, and the insulating pattern after removing the photoresist pattern, and wherein the forming of the capping insulating layer includes applying heat to the gate structure to transform a damaged region on a sidewall of the conductive pattern into a recrystallized region.

* * * * *